(12) United States Patent
Chang et al.

(10) Patent No.: US 8,682,631 B2
(45) Date of Patent: Mar. 25, 2014

(54) SPECIFICATIONS-DRIVEN PLATFORM FOR ANALOG, MIXED-SIGNAL, AND RADIO FREQUENCY VERIFICATION

(76) Inventors: Henry Chung-herng Chang, Cupertino, CA (US); Kenneth Scott Kundert, Mountain View, CA (US)

( * ) Notice: Subject to any disclaimer, the term of this patent is extended or adjusted under 35 U.S.C. 154(b) by 599 days.

(21) Appl. No.: 12/872,878

(22) Filed: Aug. 31, 2010

(65) Prior Publication Data
US 2011/0054875 A1  Mar. 3, 2011

Related U.S. Application Data

(60) Provisional application No. 61/239,664, filed on Sep. 3, 2009.

(51) Int. Cl.
*G06F 17/50* (2006.01)
*G06F 9/445* (2006.01)

(52) U.S. Cl.
USPC ...... 703/13; 703/14; 703/20; 712/2; 716/103; 716/104

(58) Field of Classification Search
USPC ............. 703/13, 14, 20; 712/2; 716/103, 104
See application file for complete search history.

(56) References Cited

U.S. PATENT DOCUMENTS

| | | | |
|---|---|---|---|
| 5,363,320 A | 11/1994 | Boyle et al. | |
| 5,369,604 A | 11/1994 | Ravindranath et al. | |
| 5,463,563 A | 10/1995 | Bair et al. | |
| 5,963,724 A | 10/1999 | Mantooth et al. | |
| 7,278,122 B2 * | 10/2007 | Willis | 716/104 |
| 7,562,001 B2 * | 7/2009 | Arevalo et al. | 703/14 |
| 7,805,690 B2 * | 9/2010 | Willis | 716/103 |
| 2005/0289485 A1 * | 12/2005 | Willis | 716/1 |
| 2007/0050758 A1 * | 3/2007 | Arevalo et al. | 717/135 |
| 2008/0048675 A1 | 2/2008 | Ngoya et al. | |
| 2008/0250360 A1 * | 10/2008 | Willis | 716/2 |
| 2011/0055516 A1 * | 3/2011 | Willis | 712/2 |

OTHER PUBLICATIONS

Daems, "Simulation-based Automatic Generation of Signomial and Posynomial Performance Models for Analog Integrated Circuit Sizing," IEEE/ACM International Conference on Computer Aided Design, 2001.
Tiwary, "First Steps Towards SAT-based Formal Analog Verification," IEEE/ACM International Conference on Computer Aided Design, 2009.
Antao, "Automatic Analog Model Generation for Behavioral Simulation," IEEE Custom Integrated Circuits Conference, 1992.
Mukherjee, "A Formal Approach for Specification-Driven AMS Behavioral Model Generation," Design, Automation, and Test in Europe Conference, 2009.

* cited by examiner

*Primary Examiner* — Thai Phan

(57) ABSTRACT

A design specifications-driven platform (100) for analog, mixed-signal and radio frequency verification with one embodiment comprising a client (160) and server (150) is presented. The server comprises an analog verification database (110), a code and document generator (1020), a design to specifications consistency checker (103), a symbol generator (104), a coverage analyzer (105), a server interface (106), a web server (111), and an analog verification server application (101). The client comprises a web browser (130), generated datasheets and reports (120), generated models, regression tests, netlists, connect modules, and symbols (121), generated simulation scripts (122), a client interface (124), design data (131), simulators (132), and a design data extractor (123).

20 Claims, 16 Drawing Sheets

FIG. 9

Figure 1:
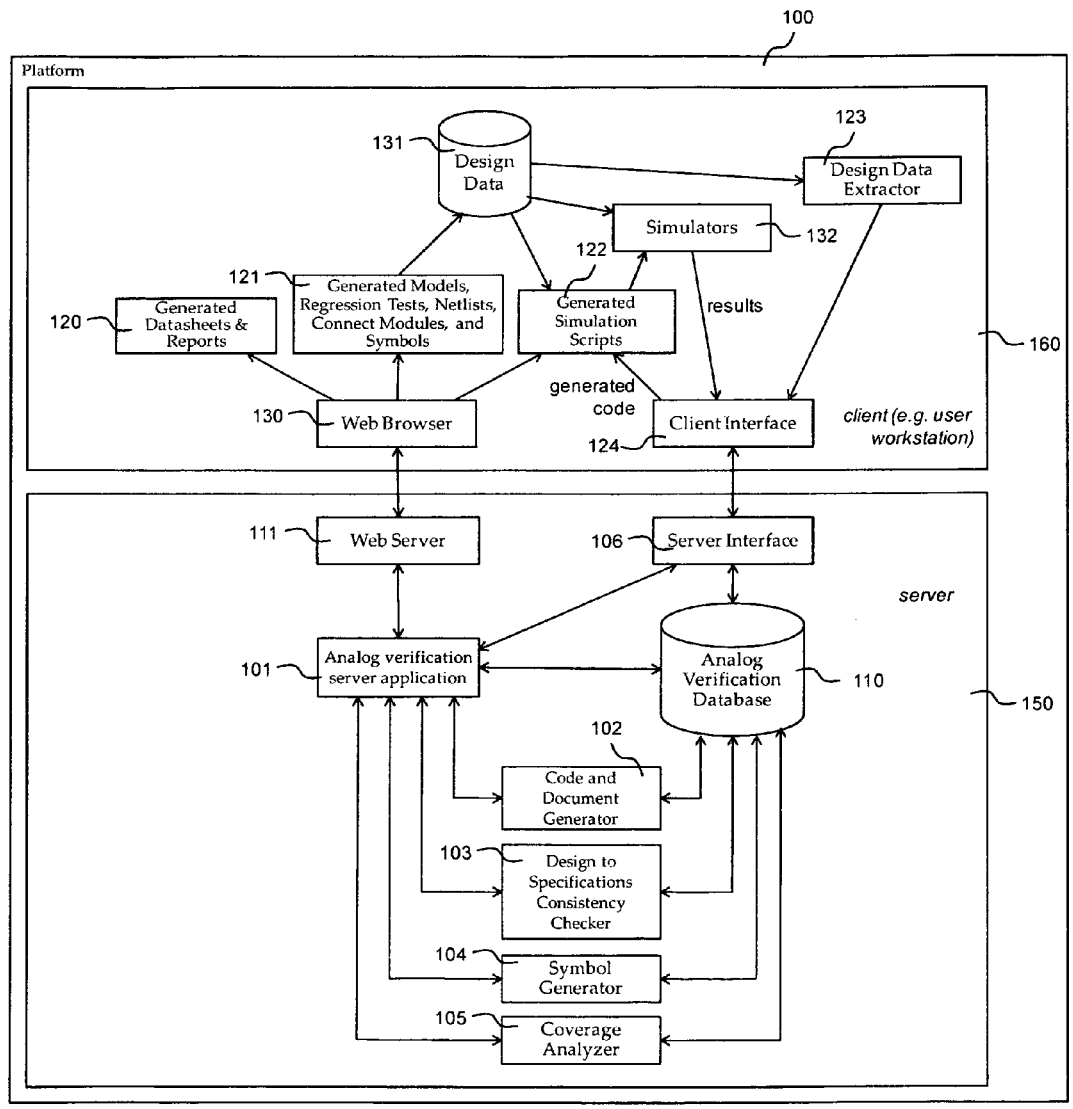

| Table/Fields in Table | Parameters | Port Types | Ports | Discrete Variables | Continuous Variables | Branches | Instances | Register & GCS Map | States | Test Sequences | Look-up Tables | User Defined Code | User Comments |
|---|---|---|---|---|---|---|---|---|---|---|---|---|---|
| Name | ✓ | ✓ | ✓ | ✓ | ✓ | ✓ | ✓ | ✓ | ✓ | ✓ | ✓ | ✓ | ✓ |
| Description | ✓ | ✓ | ✓ | ✓ | ✓ | ✓ | ✓ | ✓ | ✓ | ✓ | ✓ | ✓ | ✓ |
| Value | ✓ | ✓ | | ✓ | ✓ | | | | | | | | |
| Aliases | | ✓ | | | | | | | | | | | |
| Differential | | ✓ | | | | | | | | | | | |
| Access Methods | | ✓ | | | | | | | | | | | |
| Pin Types | | ✓ | | | | | | | | | | | |
| Supply Domain | | ✓ | | | | | | | | | | | |
| Direction | | | ✓ | | | | | ✓ | | | | | |
| Port Type | | | ✓ | | | | | | | | | | |
| Range | | | ✓ | | | | | | | | | | |
| Behavior | | | ✓ | | | ✓ | | | | | | | |
| Protected Variable | | | ✓ | | | | | | | | | | |
| Affects Analog | | | ✓ | ✓ | | | | | | | | | |
| Reference Port | | | ✓ | | | | | | | | | | |
| Gmin | | | ✓ | | | ✓ | | | | | | | |
| Pin Number | | | ✓ | | | | | | | | | | |
| Order | | | ✓ | | | | | | | ✓ | | | |
| Attributes | | | ✓ | | | | | | | | | | |
| Symbol Information | | | | | | | | ✓ | | | | | |
| Tests Metrics | | | ✓ | | | | | | | | | | |
| Variable Type | | | | ✓ | | | | | | | | | |
| Trigger | | | | ✓ | | | | | | | | | |
| Wait | | | | ✓ | | | | | | | | | |
| Initial | | | | ✓ | | | | | | | | | |
| Measurement Unit | | | | ✓ | ✓ | | | | | | | | |
| Smooth | | | | | ✓ | | | | | | | | |
| Branch Type | | | | | | ✓ | | | | | | | |
| Connects | | | | | | ✓ | | | | | | | |
| Item Parameters | | | | | | | ✓ | | | | | | |
| Instance Reference | | | | | | | ✓ | | | | | | |
| Location | | | | | | | ✓ | ✓ | | | | ✓ | |
| Default & State Columns | | | | | | | | ✓ | ✓ | | | | ✓ |

| | Name | Direction | Port Type | Description | Range | Behavior | Protected Variable | Affects Analog | Reference Port | Gmin |
|---|---|---|---|---|---|---|---|---|---|---|
| | 1102 | 1110 | 1111 | 1103 | 1112 | 1113 | 1114 | 1115 | 1116 | 1117 |
| 1201 | vdd | input | supply | Positive Supply | 1.1 to 1.5 | Enable? 1m : 1n | | | | |
| 1202 | gnd | input | ground | Ground | -10m to 10m | | | | | |
| 1203 | gain[7:0] | input | binary | Gain Setting | | | Gain | yes | | |
| 1204 | enable | input | digital | Enable pin | | | Enable | yes | | |
| 1205 | in | input | voltage | Input voltage | | | | | | |
| 1206 | out | output | voltage | Output voltage | | Enable ? Gain * V(in) : 0 | | | | |

FIG. 10

| Input Field | Example Options |
|---|---|
| Parameters | design name, designer name, time unit, time precision, transition time, glitch, Gmin, Ron, fault variable name, testbench name, differential suffixes, bit order, model file name, model cell name, model library name, model view name |
| Pin Types | wire, wreal, electrical, analog wire |
| Port Direction | input, output, inout |
| Port Types | digital, binary, voltage, current, ibias, supply, ground, differential, cml |
| Discrete Variable Types | wire, reg, integer, wreal, real, analog wire |
| Branch Types | electrical, ground, branch, capacitor, elastor, resistor, conductor, reluctor, switch, inductor, clamp |
| Instance Reference | Link to other spec sheet, masters in the design data |

FIG. 11

```
/*
 * Gain (Examples.gain:verilogams)
 *
 * Design engineer: Designer's Name
 * Verification engineer: Verifcation Engineer's Name
 */

`include "disciplines.vams"
`include "constants.vams"
`timescale 1s/1ps
`define tick 1 module gain (
  vdd,
  gnd,
  gain,
  enable,
  out,
  in
);
input vdd; electrical vdd;        // Positive Supply
input gnd; electrical gnd;        // Ground
input [7:0] gain;                 // Gain Setting
input enable;                     // Enable pin
output out; electrical out;       // Output Voltage
input in; electrical in;          // Input voltage // Protected local copies of digital port values
wire [7:0] Gain = (^gain !== 1'bx ? gain : 0);
wire Enable = (^enable !== 1'bx ? enable : 0);

// Discrete variables
wor Fault = 1'b0;                 // Global fault variable // Fault variables (put in their own scope to consolidate them)
begin : _faults
  wire vdd_value_fault;
  wire gnd_value_fault;
  wor BitOrderFault;
end // Uninteresting discrete variables (put in their own scope to hide them)
initial begin : _localVars
  reg break;
  reg [256*8-1:0] name;
  reg vdd_value_okay;
  reg gnd_value_okay;
  $sformat(name, "%m (gain)");
  vdd_value_okay = 1'b1;
  gnd_value_okay = 1'b1;
end
```

FIG. 15

```
// check for V(vdd) out of range
always @(cross(V(vdd) - 1.1) or cross(V(vdd) - 1.5) or above(1))
    _localVars.vdd_value_okay = ((V(vdd) >= 1.1) && (V(vdd) <= 1.5));
assign #(25n) _faults.vdd_value_fault = (_localVars.vdd_value_okay != 1'b1);
always @(_faults.vdd_value_fault === 1'b1)
    `TESTBENCH.reportFault(_faults.vdd_value_fault,_localVars.name,"V(vdd) out of range");
assign Fault = _faults.vdd_value_fault === 1'b1;

// check for V(gnd) out of range
always @(cross(V(gnd) - -10m) or cross(V(gnd) - 10m) or above(1))
    _localVars.gnd_value_okay = ((V(gnd) >= -10m) && (V(gnd) <= 10m));
assign #(25n) _faults.gnd_value_fault = (_localVars.gnd_value_okay != 1'b1);
always @(_faults.gnd_value_fault === 1'b1)
    `TESTBENCH.reportFault(_faults.gnd_value_fault,_localVars.name,"V(gnd) out of range");
assign Fault = _faults.gnd_value_fault === 1'b1;

// check for bit order errors on vectors
assign _faults.BitOrderFault = !(7 > 0);   // gain
always @(_faults.BitOrderFault === 1'b1)
    `TESTBENCH.reportFault(_faults.BitOrderFault,_localVars.name,"bit order error");
assign Fault = _faults.BitOrderFault === 1'b1;
```
— 2311

```
// the following is used for time-step control in the analog block
always begin
    _localVars.break = (_localVars.break != 1'b1);
    @(enable or
      gain);
end analog begin
// force kernel to place timepoints when discrete signals change
@(posedge _localVars.break or negedge _localVars.break)
    ;
```

```
// drive ports
I(vdd) <+ Enable ? 1m : 1n;
V(out) <+ Enable ? Gain * V(in) : 0;
```
— 2312

```
end
endmodule
```

2301B

FIG. 16

SPECIFICATIONS-DRIVEN PLATFORM FOR ANALOG, MIXED-SIGNAL, AND RADIO FREQUENCY VERIFICATION

CROSS-REFERENCE TO RELATED APPLICATIONS

This application claims the priority of U.S. Provisional Patent Application No. 61/239,664 filed on Sep. 3, 2009 by the present inventors, which is incorporated by reference herein.

FEDERALLY SPONSORED RESEARCH

Not Applicable

SEQUENCE LISTING OR PROGRAM

Not Applicable

FIELD OF INVENTION

This invention relates to the creation of a design specifications-driven platform for analog, mixed-signal, and radio frequency verification in the field of analog, mixed-signal, and radio frequency ("RF") integrated circuit ("IC") and system design and verification. A mixed-signal design is a design that includes analog and digital design. The term analog includes purely analog, mixed-signal, radio frequency, and any combination of these types of designs. A design may be an entire IC, a subblock of an IC, or a component of an IC.

BACKGROUND

The design of a complex analog, mixed-signal, or RF IC is a large undertaking involving a design team which may include system designers, digital designers, analog designers, and a chip level implementation team. Distinct and separate from the design team may be a verification team, whose sole focus is to check the work of the design team. In general, when designing any large, complex system, a distinct and separate verification task may become necessary when the complexity of what is being designed increases to a point where the designer or designers may no longer be able to adequately check their own work. In digital IC design, this point occurred in the mid 1990's. The design of complex analog, mixed-signal, and RF ICs has now reached this point. Design bugs or errors now occur in the analog section, in the interface between the analog and digital section, and in the digital section that works closely with the analog. The root causes for these errors include miscommunication between the design teams, incorrect interpretation of the design specifications, incorrect or incomplete design specifications, and simple human error. It is these symptoms that suggest that a distinct and separate analog verification task may be necessary.

Analog, mixed-signal, and RF designs begin with the creation of at least one specification for the design. Typically, there is a plurality of specifications for a design. Depending on the design team, specifications may be formal and detailed, or these specifications may be as informal as a set of handwritten notes. Regardless, there are specifications that represent some level of understanding of what the analog design is to do as agreed to with the end user of the design. A typical flow is that from the specifications, the designers implement the design. When completed, the design is translated to layout. The layout is checked to match the design and to be design rule correct. If there is digital layout, the analog layout is then combined with the digital layout. Additional checks are conducted on the final layout. Once all of the checks pass, the design is released to manufacturing. After manufacturing, each chip is tested to validate that they are working.

Designs may be implemented hierarchically where there is a top or a chip level comprising blocks or components. The design may be implemented starting from the top, starting from the blocks, or both. The blocks, components, top-level, and chip-level have ports consisting of inputs, outputs, and bidirectional signals that facilitate communication from one part of the design to another.

The purpose of analog verification is to validate that the analog design meets its specifications, that the analog is properly connected to the rest of the design, and that in conjunction with the register transfer logic ("RTL") that has been developed, that the IC behaves correctly. A key technology used when verifying designs is the use of computer simulators. Computer simulators allow the designer or verification engineer to predict what the design will do prior to manufacturing the design. A limitation of computer simulations is that simulations may be very time consuming. At present, simulating the analog section with all of the transistors with the rest of the IC is prohibitive, because the simulations times are too long. These simulation times may range from weeks to months. Even simulating the analog section alone may be prohibitive. To address this issue, analog verification relies on a model representation of the design and the design components. This is often referred to as a behavioral model. Behavioral models, when written properly, simulate much faster than the design. To use this model, however, it is critical that the model be proven to match the design implementation. If the model does not match the design, there is no certainty as to whether or not the design is truly being verified. To verify the consistency of the model and the design, a self checking regression test is applied independently to the model and the design. The regression tests apply stimulus to either the model or the design and checks the outputs of what is being tested. The expected outputs are determined by the specifications. If the actual outputs match the expected outputs, then to what the regression tests are applied and specifications are consistent. If both the model and design are consistent with the specifications, then the model and design are consistent, and therefore, the model, the design, and the specifications are consistent.

Analog verification is a new field in which there is little automation. Datasheets, reports, models, regression tests, netlists that combine blocks together, connect modules, symbols, and simulation scripts are usually written manually. Designers and verification engineers typically use templates or files written for a previous project as a starting point to gain efficiency. Of the automation that does exist in the field of analog verification, most fall under the categories of formal techniques, model generation, and testbench generation with most of the work in model generation.

In all fields of study, there is much literature on model generation, essentially the idea of building an abstract representation of something detailed. However, different techniques are required for different disciplines. For example, in the field of electronic design automation of which aiding in the design of analog, mixed-signal, and RF ICs is a part, there are techniques for the generation of digital models, digital system level models, and transistor device level models. U.S. Pat. No. 5,363,320 to Graeme Boyle, Susan Bergquist, Ernest McReynolds, and Matson Haug (1993) describes an approach to device or component level modeling. Devices include transistors, resistors, capacitors, and inductors. The creation of a behavioral model of an analog block which is a combination of devices requires different techniques in that abstraction or the removal of detailed behavior is required. One of the primary goals of having an analog model is that it simulate faster than a complete description of the design. The goal of device modeling is to have a very accurate representation of the devices where detailed behavior is included. U.S. Pat. No. 5,463,563 to Owen Bair, Patrick Yin, and Chih-Chung Chen (1995) describes an automatic modeling approach for logic, a subset of digital. The focus is on generating accurate timing information. Since analog signals fundamentally differ from digital signals, this work cannot be applied to creating analog behavioral models. Digital signals have a fixed number of values, usually two, on or off. Analog signals are continuous and may take on any value within a range. As a result, different modeling techniques are required. Also, simulating analog signals may require a different simulator, and therefore, different types of models. An event-driven simulator is typically used to simulate digital designs. Simulating analog signals often requires a simulator have an ordinary differential equation solver engine. This type of engine is known as a SPICE engine or an analog simulator. A SPICE engine requires solving a network of simultaneous equations. Simulators that have both an event-driven simulation engine and SPICE engine are generally known as AMS simulators or mixed-signal simulators. Modeling languages targeted for analog include Verilog-A, Verilog-AMS, and VHDL-AMS. Custom language extensions to Verilog and SystemVerilog have also been written to extend an event-driven engine to be able to accommodate some amount of analog modeling. Analog modeling may be accomplished using a digital language, but in many circumstances, an analog modeling language or a digital language with custom extensions is required. Model generation techniques in other fields, such as digital, do not use analog modeling languages nor do they use custom analog extensions to a digital language.

In the field of analog model generation, two basic approaches have been proposed. The first is based on an abstract description of the design such as a specification or equations representing the function that the design is to perform, and the second is based on the implementation of the design itself The latter requires that the design be completed before the model can be created. "Simulation-based Automatic Generation of Signomial and Posynomial Performance Models for Analog Integrated Circuit Sizing" by Walter Daems, Georges Gielen, and Willy Sansen presented at the IEEE/ACM International Conference on Computer Aided Design in 2001 describes a technique to create signomial and posynomial performance models based on SPICE or circuit simulation of the implementation of the design to be modeled. "First Steps Towards SAT-based Formal Analog Verification" by Saurabh Tiwary, Anubhav Gupta, Joel Phillips, Claudio Pinello, Radu Zlatanovici presented at The IEEE/ACM International Conference on Computer Aided Design in 2009 describes an alternative method for analog verification. In both cases the implementation of the design in the form of a netlist of all of the devices and how these devices interconnect is required.

For the model generation approaches that begin with an abstract description of the design, the prior art for this approach may be broken into two types of methods. The first is circuit type based, where specific knowledge of the type of analog, mixed-signal, or RF circuit being modeled needs to be pre-written into the tool generating the models. This knowledge may be in the form of equations or templates for the models where typically all that is required of the user is to enter parameters for the type of circuit. Often, model templates or equations specific to the circuit type are build into the tool. "Automatic Analog Model Generation for Behavioral Simulation" by Brian Antao and Fatehy El-Turky presented at the IEEE Custom Integrated Circuits Conference in 1992 discusses the generation of behavioral models for s-domain and z-domain filters. The input to the model generator are the coefficients for the filters. In this case, specific domain knowledge about s-domain and z-domain filters, two types of circuits, are pre-programmed into the generator. "A Formal Approach for Specification-Driven AMS Behavioral Model Generation" by Subhankar Mukherjee, Antara Ain, S Panda, Rejdeep Mukhopadhyay, and Pallab Dasgupta presented at the Design, Automation, and Test in Europe Conference in April, 2009 describes a method in which the user enters specifications including the type of circuit being modeled to generate behavioral models. In this paper, the authors use as an example to describe their approach, a low drop out (LDO) regulator and explain how domain knowledge for LDOs is included in their tool. US Patent Application Publication 2008/0048675 by Edouard Ngoya and Jean Rousset (published 2008) describes a method to accurately create a noise model in RF circuits. This is focused on analyzing a specific class of circuits, RF oscillators, RF mixers, and RF amplifiers, where built in knowledge of these types of circuits are required. This publication is also more of an analysis technique and not a method for generating a behavioral model of a design. The second type of the description based approaches to model generation is to enter a description of the design using a schematic capture tool or topology editor tool. U.S. Pat. No. 5,963,724 to H. Alan Mantooth, Christopher Wolff (1999) provides an example of this approach.

U.S. Pat. No. 5,369,604 to Naiknaware Ravindranath, G. N. Nandakumar, and Srinivasa Kasa (1994) describes an approach for automatic test plan generation. The invention described in U.S. Pat. No. 5,369,604 requires a circuit description, functional models, test models, and heuristic rules to generate the test plan.

Advantages

The invention described in this patent application, part of which generates models and regression tests, uses the approach where one starts from an abstract description of the design in the form of specifications. This has the advantage that the implementation of the design does not have to exist before the model and regression test may be generated. There is also the advantage that the generation may be done in a significantly faster manner as circuit simulation is not involved. This invention also does not require circuit-type specific information. For example, common analog blocks include LDOs, analog-to-digital converters, digital-to-analog converters, amplifiers, mixers, oscillators, phased-locked loops. When using the method described in this invention to generate models and regression tests, the type of analog design being modeled does not have to be specified. The advantage is that a wider variety of analog blocks may be modeled. Often analog blocks comprise various types of analog blocks. It is infeasible for generators to anticipate all combinations. Since this invention does not require domain or circuit specific knowledge, analog blocks comprised of other analog blocks may be generated. This invention also does not require that the user enter a topology as a way of describing the design. The user need only enter the specifications for the design. The advantage is that the information entered may be more abstract and is closer to how the designer would naturally write specifications for their design. Finally, for the generation of models and regression tests, the invention described in this patent application requires only the specifications. Additional information is not required. This has the advantage over the prior art that requires more information, in that a reduced set of information is required, thus saving the user time when providing the input required for the generator.

SUMMARY

In accordance with one embodiment, this invention is a design specifications-driven platform for analog, mixed-signal, and radio frequency verification for accelerating and improving the quality of the design and verification effort. This invention starts where the analog design starts, namely the design specifications. This invention provides a method for verifying an analog, mixed-signal, or radio frequency design where at least one specification is entered for the design, where the specification is stored, where a code and document generator is used to convert the specification to a behavioral model. The specification may contain a behavior of an analog port. Using the code and document generator and a model template, the behavior is converted into a portion of the behavioral model. Further, the code and document generator may convert the specification to a regression test, where simulations are then performed, where simulation results are stored, and where these results are used to generate a datasheet and report. Utilizing the regression test, an implementation of the design and the specification may be verified for consistency. The coverage including model coverage, regression test coverage, regression test run completeness, and assertion execution completeness may be measured. The code and document generator may also generate netlists, connect modules, simulation launch scripts, simulation launch script configuration files and schematic symbols. The quality of analog verification is improved as automated generation prevents manual errors from being introduced when a manual generation process is used. The quality of analog verification is also improved as the analysis capabilities ensure that the analog verification is more complete.

DRAWINGS—FIGURES

Figure 2:
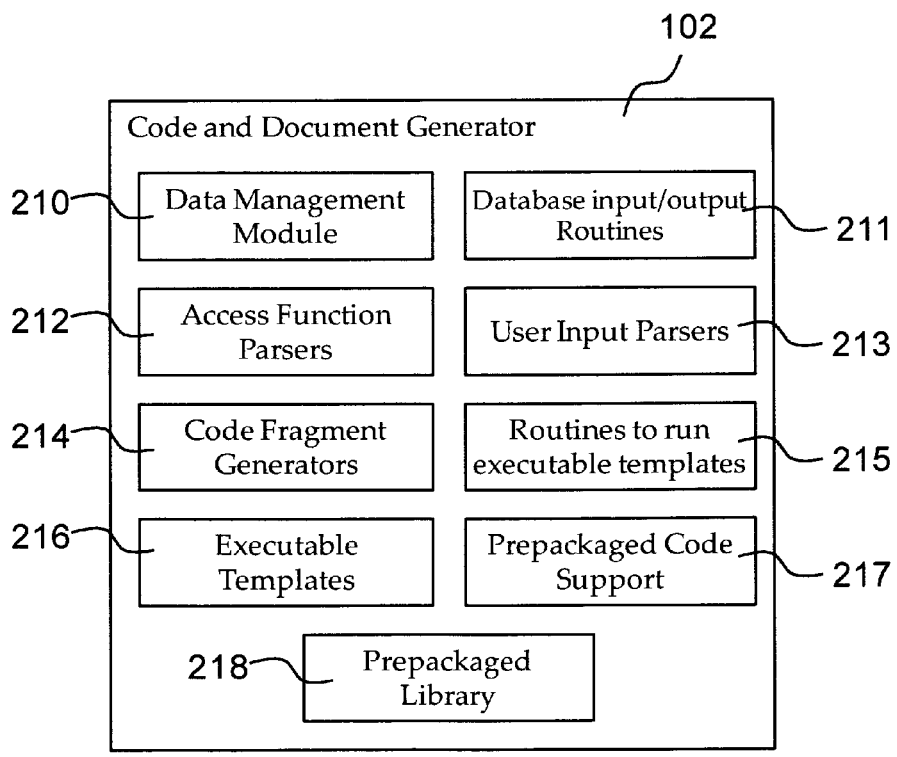
Figure 3:
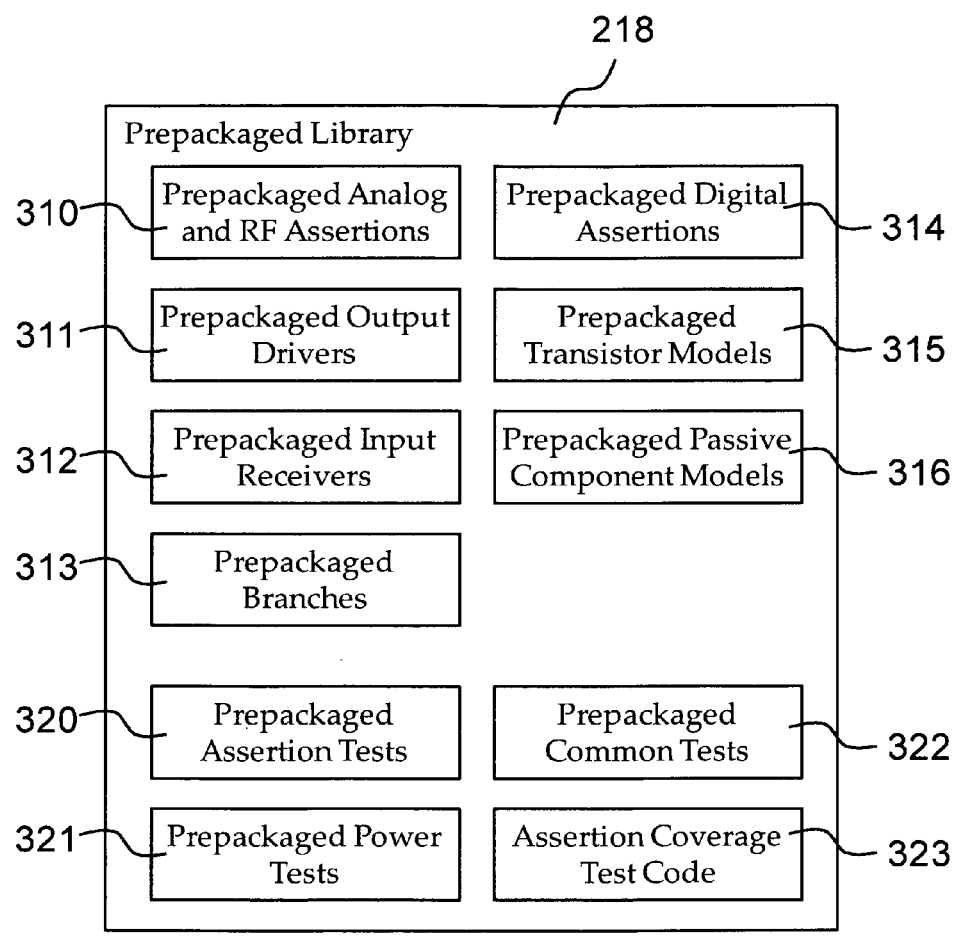
Figure 4:
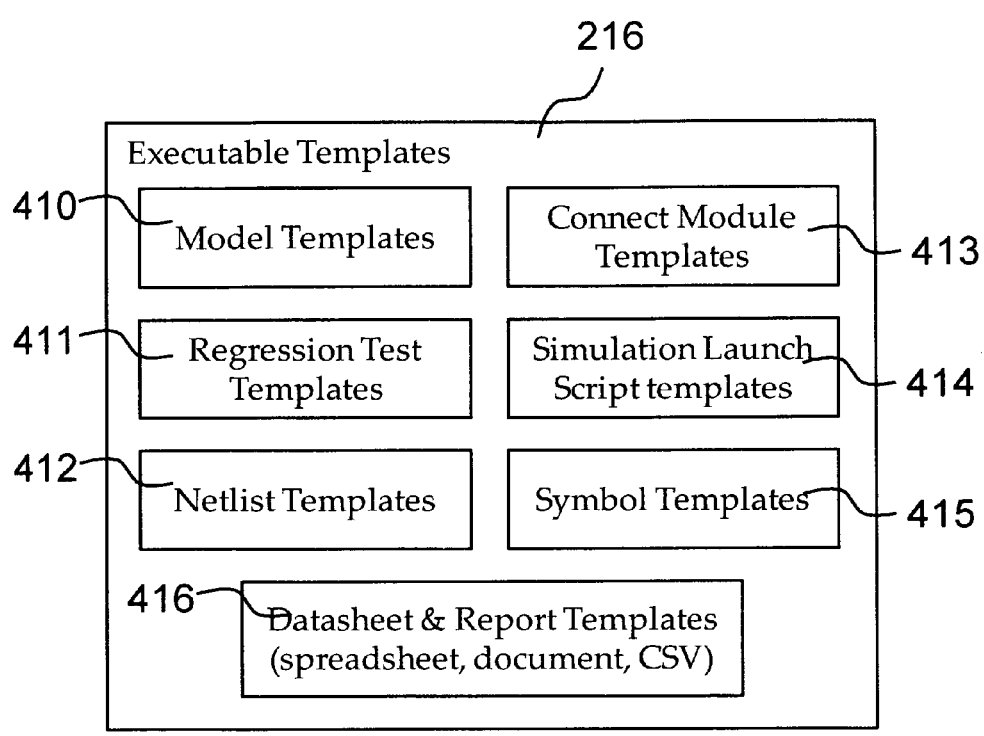
Figure 5:
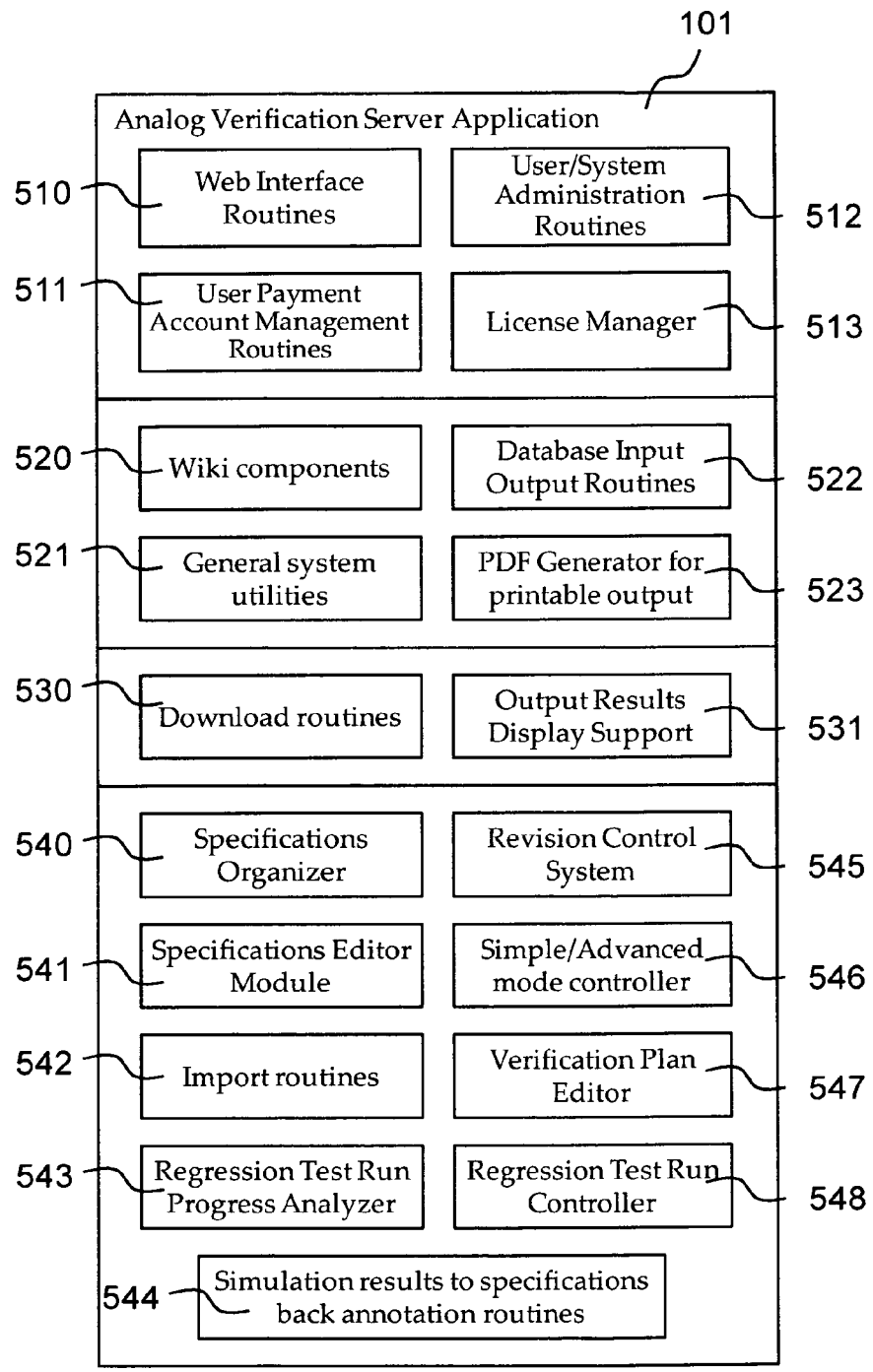
Figure 6:
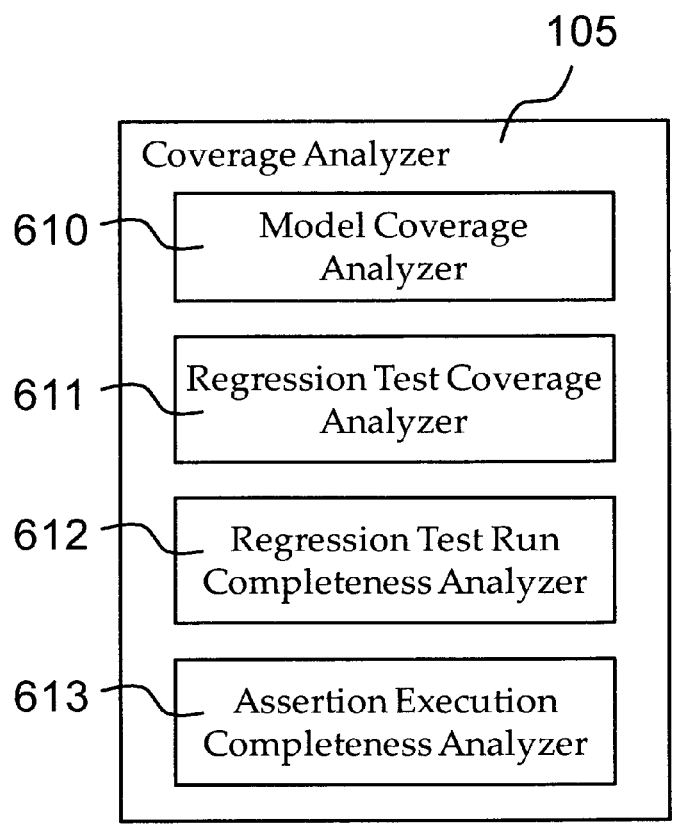
Figure 7:
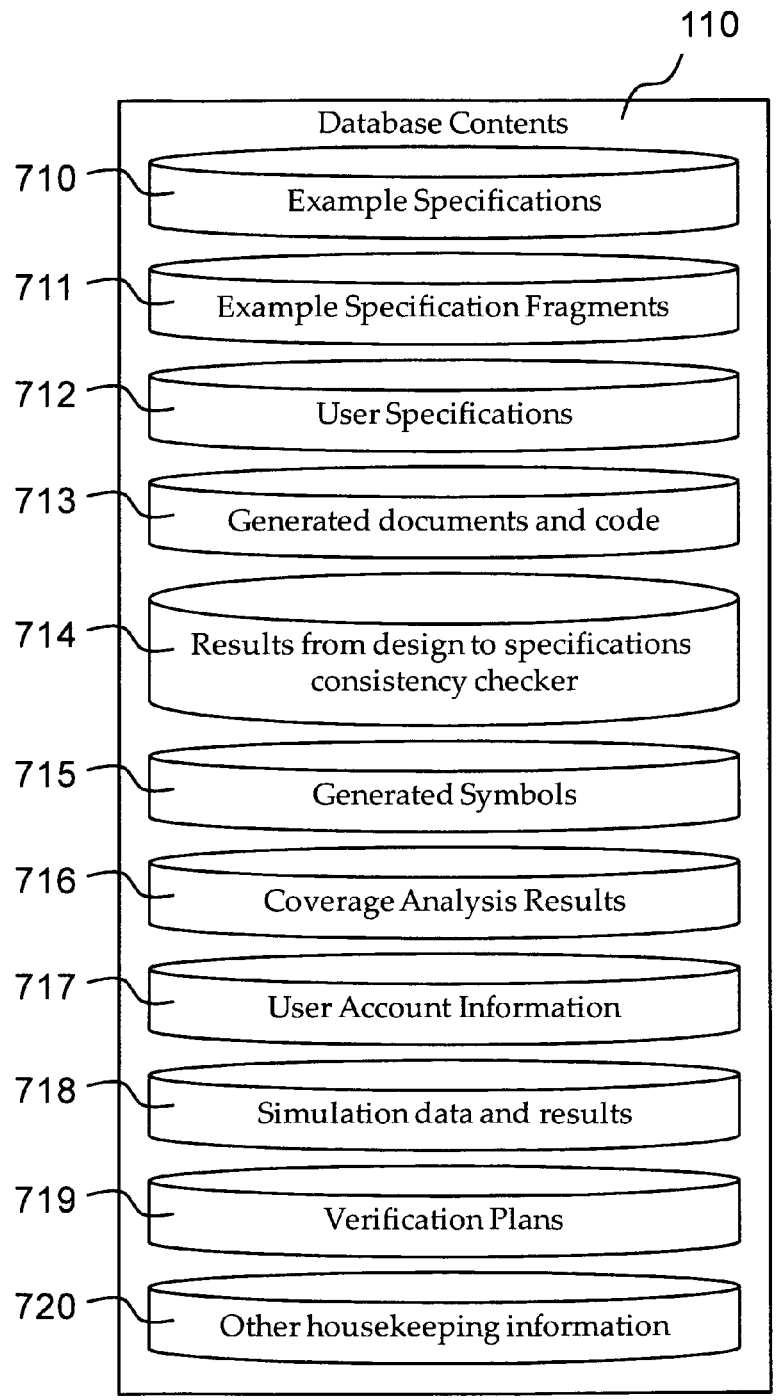
Figure 8:
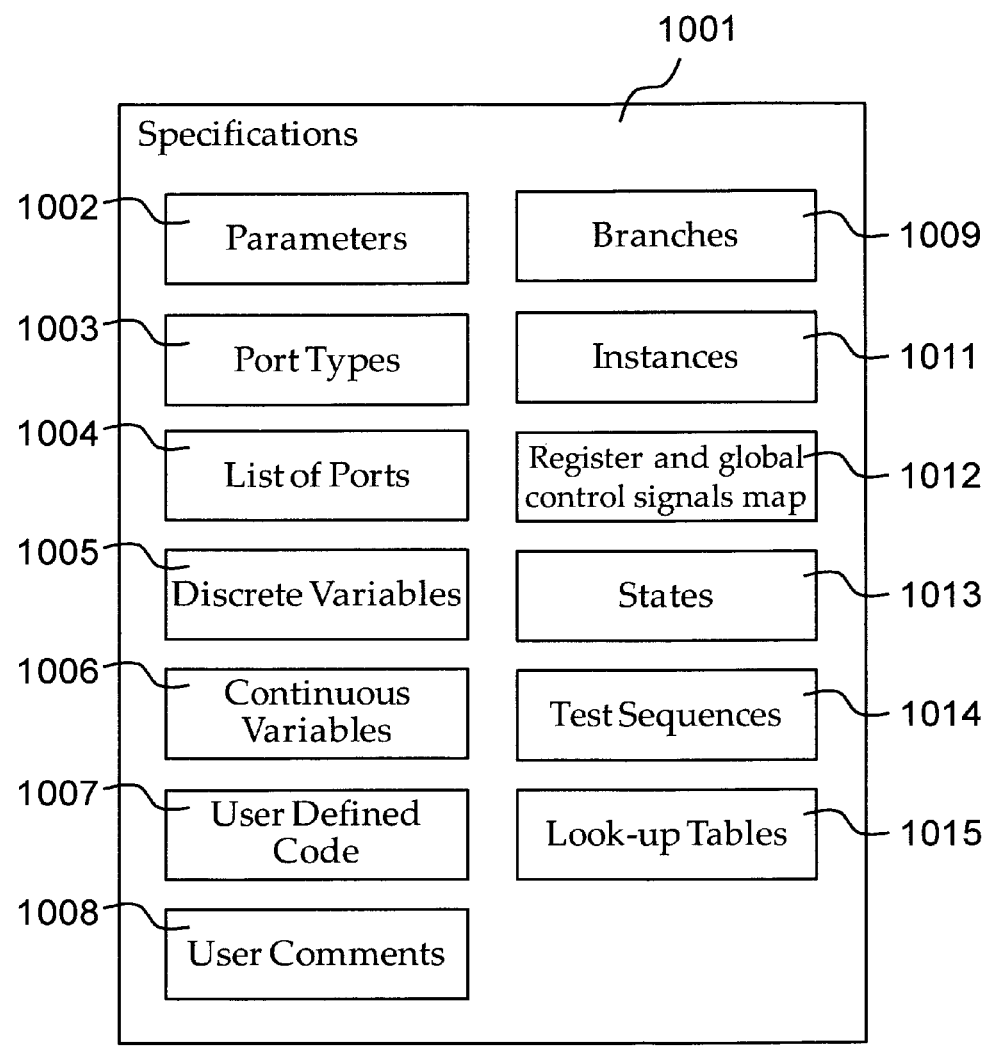
Figure 12:
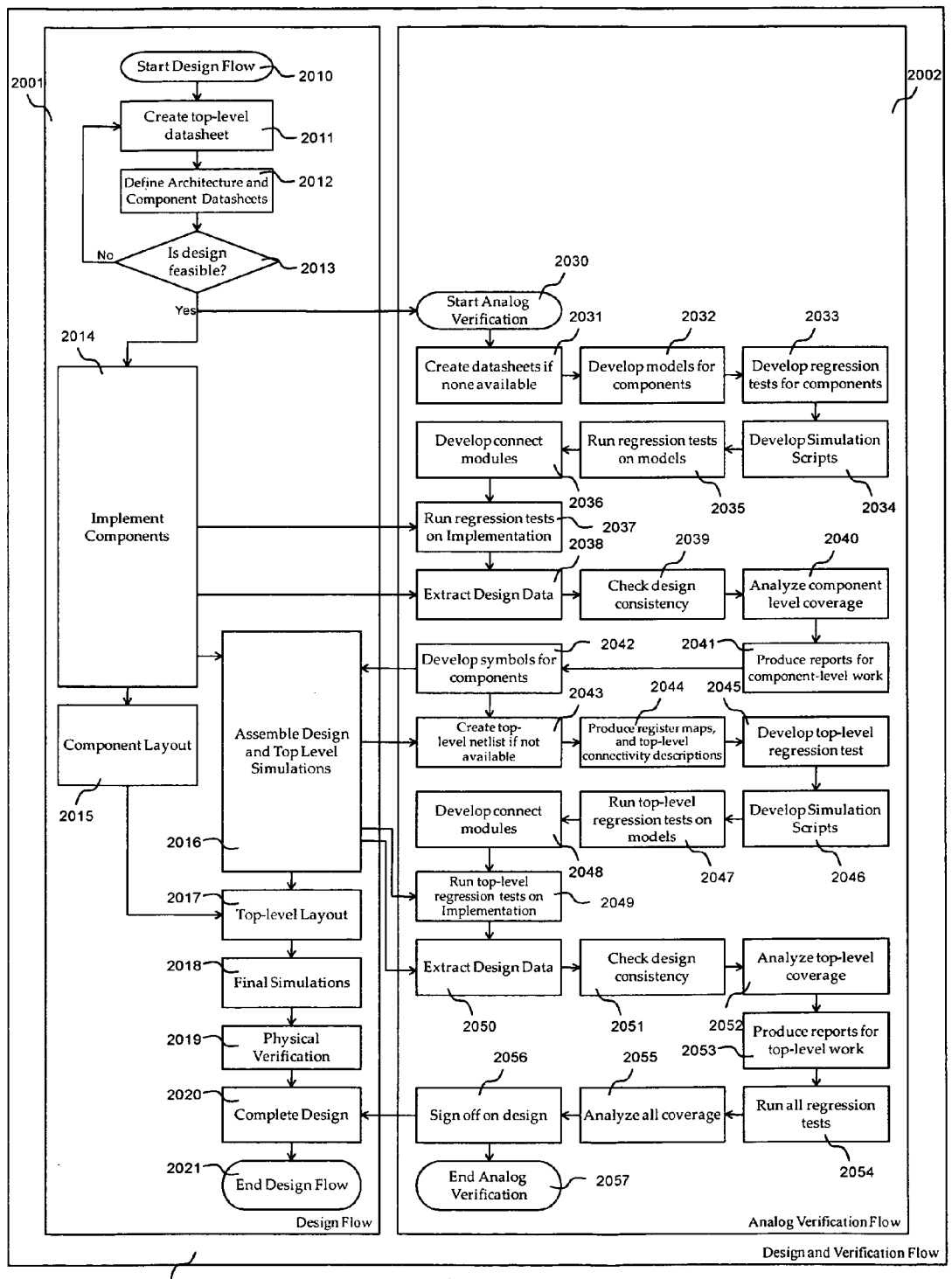
Figure 13:
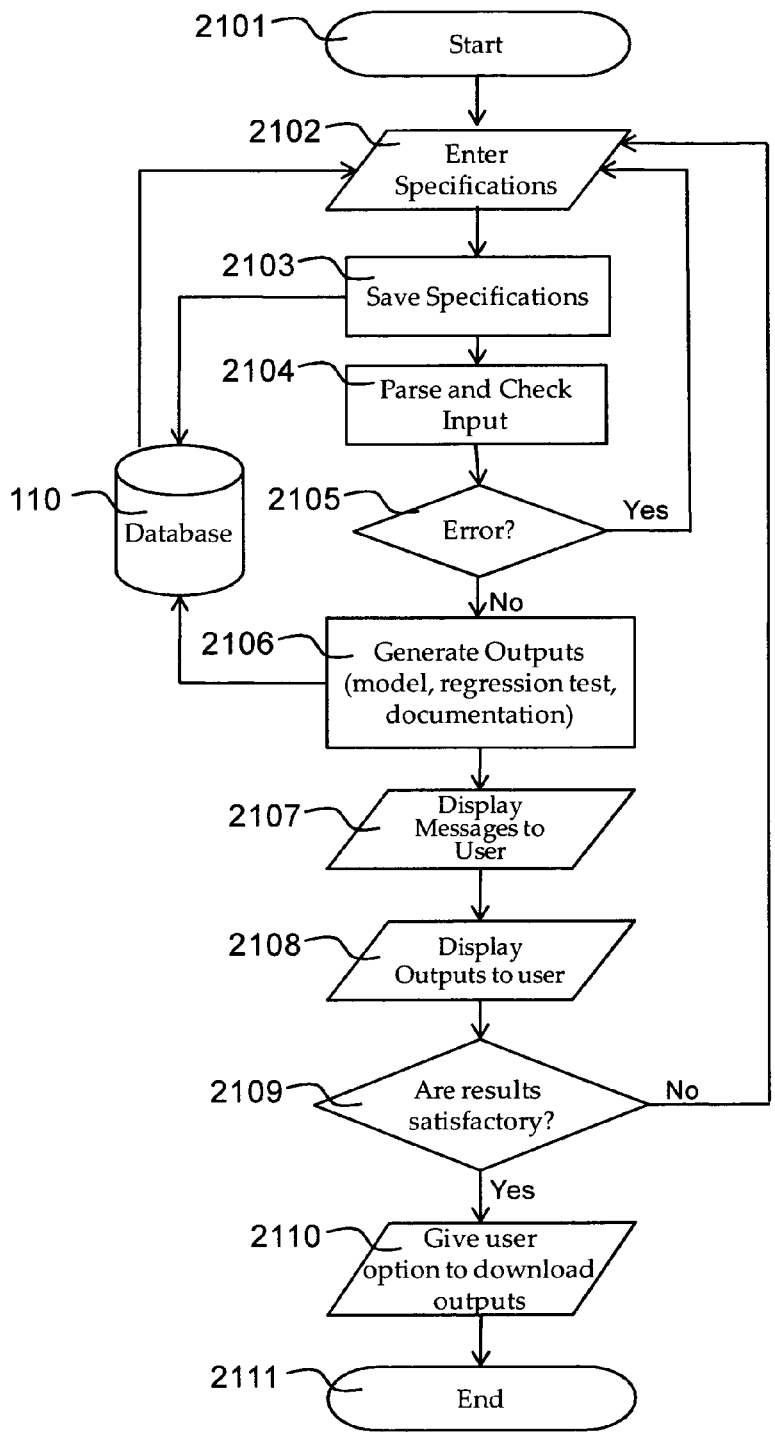
Figure 14:
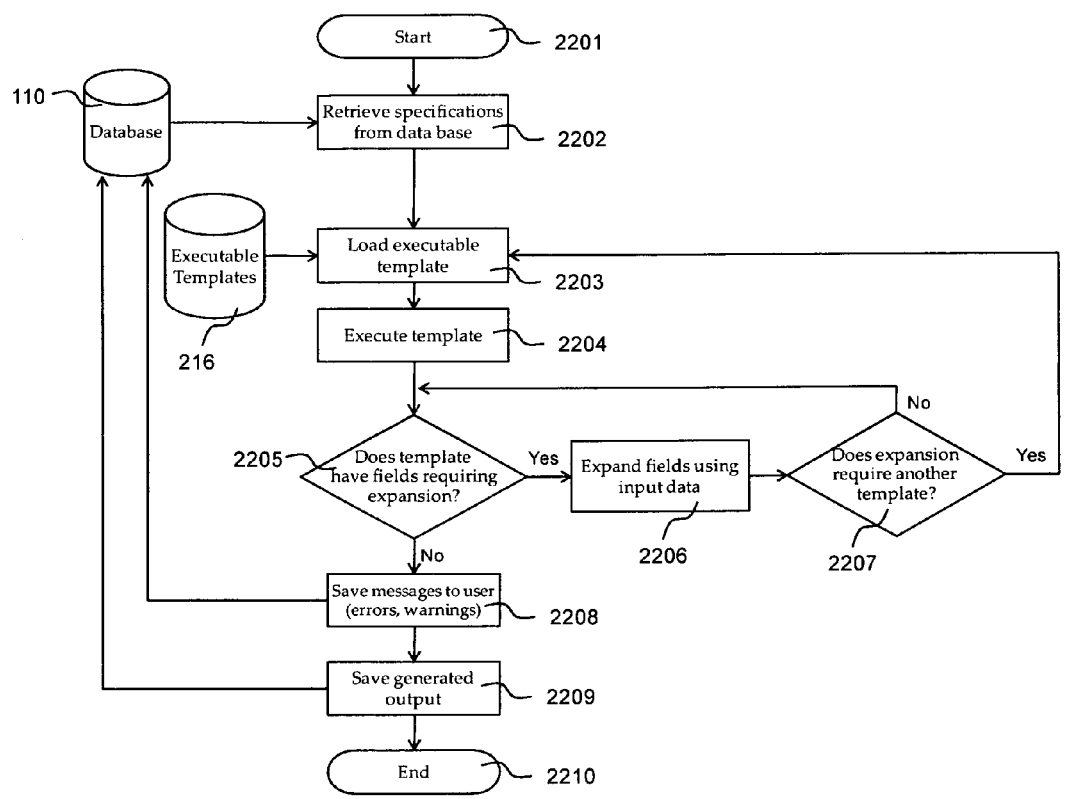

Embodiments of the invention will now be described in conjunction with the drawings, in which:
FIG. 1 shows the platform components,
FIG. 2 shows the code and document generator,
FIG. 3 shows the prepackaged library,
FIG. 4 shows the executable templates,
FIG. 5 shows the analog verification server application,
FIG. 6 shows the coverage analyzer,
FIG. 7 shows the database contents,
FIG. 10 shows the design specification contents,
FIG. 11 shows the detailed contents of design specifications,
FIG. 12 shows the example list of ports in design specifications,
FIG. 13 shows the defined input field options,
FIG. 20 is an example analog, mixed-signal, RF design and analog verification flow,
FIG. 21 is a user flow for specification entry and output generation,
FIG. 22 is an output generator flow,
FIG. 23A shows example output code—part 1, and
FIG. 23B shows example output code—part 2.

DRAWINGS—REFERENCE NUMERALS

100—platform
101—analog verification server application
102—code and document generator
103—design to specifications consistency checker
104—symbol generator
105—coverage analyzer
106—server interface
110—analog verification database
111—web server
120—generated datasheets and reports
121—generated models, regression tests, netlists, connect modules, and symbols
122—simulation scripts
123—design data extractor
124—client interface
130—web browser
131—design database
132—simulators
150—server
160—client
210—data management module
211—database input/output routines
212—access function parser
213—user input parsers
214—code fragment generators
215—routines to run executable templates
216—executable templates
217—prepackaged code support
218—prepackaged library
310—prepackaged analog and rf assertions
311—prepackaged output drivers
312—prepackaged input receivers
313—prepackaged branches
314—prepackaged digital assertions
315—prepackaged transistor models
316—prepackaged passive component models
320—prepackaged assertion tests
321—prepackaged power tests
322—prepackaged common test
323—assertion coverage test code
410—model templates
411—regression test templates
412—netlist templates
413—connect module templates
414—simulation launch scripts
415—symbol templates
416—datasheet & report templates
510—web interface routines
511—user payment account management routines
512—user/system administration routines
513—license manager
520—wiki components
521—general system utilities
522—database input output routines
523—pdf generator for printable output
530—download routines
531—output results display support
540—specifications organizer
541—specifications editor module
542—import routines
543—regression test run progress analyzer
544—simulation results to specifications back annotation routines
545—revision control system
546—simple and advanced mode controller
547—verification plan editor
548—regression test run controller
610—model coverage analyzer
611—regression test coverage analyzer 612—regression test run completeness analyzer
613—assertion execution completeness analyzer
710—example specifications
711—example specification fragments
712—user specifications
713—generated documents and code
714—results from design to specifications consistency checker
715—generated symbols
716—coverage analysis results
717—user account information
718—simulation data and results
719—verification plans
720—other housekeeping information
1001—specifications
1002—parameters
1003—port types
1004—list of ports
1005—discrete variables
1006—continuous variables
1007—user defined code
1008—user comments
1009—branches
1011—instances
1012—register and global control signals map
1013—states
1014—test sequences
1015—look-up tables
1101—detailed contents of design specifications
1102—name
1103—description
1104—value
1105—aliases
1106—differential
1107—access methods
1108—pin types
1109—supply domain
1110—direction
1111—port type
1112—range
1113—behavior
1114—protected variable
1115—affects analog
1116—reference port
1117—gmin
1118—pin number
1119—order
1120—attributes
1121—symbol information
1122—tests metrics
1123—variable type
1124—trigger
1125—wait
1126—initial
1127—measurement unit
1128—smooth
1129—branch type
1130—connects
1132—item parameters
1133—instance reference
1134—location
1135—default & state columns
1201—example supply
1202—example ground
1203—example control word
1204—example enable pin
1205—example input voltage
1206—example output voltage
1301—input field
1302—example options
1310—example parameters
1311—example pin types
1312—example port directions
1313—example port types
1314—example discrete variable types
1315—example branch types
1317—example instance types
2000—example analog, mixed-signal, rf design and analog verification flow
2001—example analog, mixed-signal, rf design flow
2002—example analog verification flow
2010—start design flow
2011—create top-level specifications
2012—define architecture and component datasheets
2013—check to see if design is feasible
2014—implement components
2015—component layout
2016—assemble design and top level simulations
2017—top-level layout
2018—final simulations
2019—physical verification
2020—complete design
2021—end design flow
2030—start analog verification
2031—create datasheets if none available
2032—develop models for components
2033—develop regression tests for components
2034—develop simulation scripts
2035—run regression tests on models
2036—develop connect modules
2037—run regression tests on implementation
2038—extract design data
2039—check design consistency
2040—analyze component level coverage
2041—produce reports for component-level work
2042—develop symbols for components
2043—create top-level netlist if not available
2044—produce register maps, and top-level connectivity descriptions
2045—develop top-level regression test
2046—develop simulation scripts
2047—run top-level regression tests on models
2048—develop connect modules
2049—run top-level regression tests on implementation
2050—extract design data
2051—check design consistency
2052—analyze top-level coverage
2053—produce reports for top-level work
2054—run all regression tests
2055—analyze all coverage
2056—sign off on design
2057—end analog verification
2101—start of user flow for invention
2102—enter specifications
2103—save specifications
2104—parse and check input
2105—check for error
2106—generate outputs
2107—display messages to user
2108—display outputs to user
2109—check if results are satisfactory
2110—give user option to download outputs
2111—end of user flow for invention
2201—start of output generator flow 2202—retrieve specifications from data base
2203—load executable template
2204—execute template
2205—check if template has fields requiring expansion
2206—expand fields using input data
2207—check if expansion requires another template?
2208—save messages to user
2209—save generated output
2210—end of output generator flow
2301A—first half example generated model
2310—declarations section of generated model
2301B—second half of example generated model
2311—assertions section of generated model
2312—behavioral section of generated model

DETAILED DESCRIPTION

First Embodiment

One embodiment of a design specifications-driven platform for analog, mixed-signal, and radio frequency verification 100 is shown in FIG. 1. The components for the platform 100 are divided into server side 150 components and client side 160 components. There is at least one server 150 and at least one client 160 in the preferred embodiment. If there is a plurality of users, there may be a plurality of clients. If the capabilities provided by a single server is insufficient, a plurality of servers may be used. The server 150 may be a computer such as a laptop, desktop, workstation, or computer server. The server 150 has at least one processor readable storage medium containing instructions that, upon execution, result in the implementation of operations. This processor readable storage medium may be random access memory, read-only memory, static memory, dynamic memory, non-volatile memory, floppy disk, or hard disk. For optimal performance, the server 150 has high compute power and high bandwidth to the internet, and is preferably a workstation or computer server. The client 160 may be a computer such as a netbook, mini notebook computer, sub notebook computer, notebook computer, laptop, desktop, workstation, server, tablet computer, or mobile phone. The client 160 also has at least one processor readable storage medium containing instructions that, upon execution, result in the implementation of operations. To access the web based functions that the platform 100 provides, it is sufficient that the client 160 be a device with web browsing capabilities such as a personal digital assistant, mobile phone, tablet computer, or electronic book reader. The server 150 runs an operating system such as Unix, Linux, Sun Solaris, Microsoft Windows, Apple MacOS, or Chrome. The client 160 runs an operation system such as Unix, Linux, Sun Solaris, Microsoft Windows, Apple MacOS, or Android. A user of this platform uses at least one of the client side computers 160. On the server side 150, our preferred embodiment is a Linux computer server. On the client side 160, our preferred embodiment is a Linux workstation.

On the server side 150 is a web server 111 which connects to the client side 160. An analog verification server application 101 connects to the web server 111, an analog verification database 110, and functional units including a code and document generator 102, a design to specifications consistency checker 103, a symbol generator 104, and a coverage analyzer 105. The generator 102, the consistency checker 103, the symbol generator 104, and the coverage analyzer 105 also connect to the database 110. The database 110 and the analog verification server application 101 connect to a server interface 106 which connects to at least one client 160. The web server 111 may be a commercial or an open source web server such as Apache. The database 110 may be an open source or a commercial structured query language ("SQL") database such as MySQL. The analog verification server application 101 serves as a user interface capturing information from the user, storing data in the database 110, calling the functional units 102 to 105, and retuning that information to the user. The code and document generator 102 takes information from the database 110 and converts the information to at least one type of code or document. Code that is generated is meant to be interpreted by a simulator, by a computer operating system, a general purpose computer language interpreter, or an application. The application may be part of the platform 100 or may be another software application. A general purpose computer language interpreter includes scripting language interpreters. Scripting languages include bourne shell, bash shell, c-shell, python, ruby, tcl, and company proprietary extension languages such as Cadence's SKILL and Ocean. A document that is generated is meant to be interpreted by person. The design to specifications consistency checker 103 makes static checks between at least one design data repository 131 and what is in the analog verification database 110. Inconsistencies and warnings are provided to the analog verification server application 101 and returned to the user. The consistency checker 103 also checks for self consistency within the specifications. For example, information may be placed in the database 110 that specifies under what conditions certain design objects may be connected. If connections are made that violate these conditions, the consistency checker 103 issues an error and the user is notified. The symbol generator 104 takes information from the database 110 and produces at least one schematic symbol that the user may use in schematic drawings. The coverage analyzer 105 takes data from the database 110 and calculates at least one coverage metric. These metrics include the level to which the design has been verified. The server interface 106 provides an interface to the client 160 to allow data to be transferred to and from the database 110. The server interface 106 also provides an application programming interface ("API") that allows a client to access functionality provided in the analog verification server application 101 and to access and change contents in the analog verification database 110 without going through the web server 111.

On the client side 160, a web browser 130 connects to the web server 111 on the server side 150, and to generated datasheets and reports 120, generated models, regression tests, netlists, connect modules, and symbols 121, and generated simulation scripts 122. The generated models, regression tests, netlists, connect modules, and symbols 121, simulation scripts 122, a design data extractor 123, and at least one simulator 132, are connected to the design data 131. The scripts 122, simulators 132, and extractor 123 connect to a client interface 124. The client interface 124 connects to the server interface 106 on the server side 150. The web browser 130 may be an open source or a commercial web browser such as Firefox or Microsoft's Internet Explorer. In the preferred embodiment, the client 160 uses Firefox as the web browser 130. The design data 131 may include at least one file stored on a computer or include at least one database for integrated circuit design. Common integrated circuit design databases are developed by companies in the field of electrical design automation ("EDA"). Examples of integrated circuit design databases include the Cadence Database ("CDB") and OpenAccess. A combination of at least one file and at least one database may also be used. The design data 131 hold the design and implementation information for an integrated circuit or system being designed. The simulators 132 may be open source or commercial simulators developed by a company in the field of EDA. The simulators include circuit simulators, event-driven simulators, and mixed circuit and event-driven simulators. The simulators 132 may simulate at least one of many hardware description ("HDL") languages. HDL languages include Verilog, Verilog-A, Verilog-AMS, SystemVerilog, VHDL, VHDL-AMS, SystemVerilog, and SystemC. In the preferred embodiment, the reports 120, models, regression tests, netlists, connect modules, and symbols 121, and simulation scripts 122 are outputs from the server 150. The design data extractor 123 converts the information from the design data 131 to enable the checker 103. The converted information is stored in the database 110. The client interface 124 communicates with the server interface 106 to enable the transfer of data to the server 150. The transfer of data includes storing and retrieving information from the database 110.

The client 160 and the server 150 communicate via the web server 111 and the database 110. The server application 101 provides the user interface to the user by receiving inputs and creating outputs in a language that the web browser 130 may interpret such as text, hypertext markup language ("HTML"), or Javascript.

The components of the code and document generator 102 are shown in FIG. 2. The code and document generator 102 includes a data management module 210, database input and output routines 211, access function parsers 212, user input parsers 213, code fragment generators 214, routines to run executable templates 215, executable templates 216, packaged code support 217, and a prepackaged library 218. The data management module 210 handles the internal data structures. The database input and output routines 211 serves as the interface to the analog verification database 110. The user input parsers 213 convert user input to data that the code and document generator 102 may interpret and provide feedback to the user in case there is an error in the input. The access function parsers 212 convert a special type of user input that gives the user the ability to access or set quantities such as voltage or current. Access functions also provide the ability to access or to set compound quantities such as the positive quantity of a differential signal, negative quantity of a differential signal, differential mode components of a differential signal, common mode quantity of a differential signal, and a single ended value of a differential signal. The user may also define the name of the access function. The code and document generator 102 may provide many types of outputs including models, regression tests, netlists, connect modules, simulation scripts, symbols, datasheets, and reports. These types are defined in the form of the executable templates 216. The routines to run executable templates 215 support the use of the templates 216. These routines 215 aid in the interpretation of data in the executable templates 216. Output from the code and document generator 102 include elements. The elements are defined in the prepackaged library 218. The prepackaged code support 217 is required to enable the use of the prepackaged library 218. In the preferred embodiment, the components in the executable templates 215 and in the prepackaged library 218 are described using an executable document description language. The routines to run executable templates 215 and prepackaged code support 217 assist in interpreting the executable document description language format.

The components of the prepackaged library 218 shown in FIG. 3 include prepackaged analog and RF assertions 310, prepackaged output drivers 311, prepackaged input receivers 312, prepackaged branches 313, prepackaged digital assertions 314, prepackaged transistor models 315, prepackaged passive component models 316, prepackaged assertion tests 320, prepackaged power tests 321, prepackaged common tests 322, and assertion coverage test code 323. The prepackaged analog and RF assertions 310 are typically put into models to check that analog and RF inputs meet a particular criteria such as being within a range of certain values. Analog and RF assertions may also be placed in regression tests and may also check outputs. The prepackaged digital assertions 314 are typically put into models to check that digital inputs meet a particular criteria such as being within a range of values. Digital assertions may also be placed in regression tests and may also check outputs. The prepackaged output drivers 311 are predefined behavior that describe an output port of a design block. Examples of output drivers include single ended outputs, differential outputs, class b outputs, outputs that may either source or sink current, and sine wave generators. The prepackaged input receivers 312 are predefined behavior that describe an input port on a design block. For example, an input receiver could be a current input with a value for its input impedance. Another example of an input receiver is one where the user may specify a pull up or pull down resistance value. The input receivers and output drivers contain information that allow for static checks. An example of a static check includes verifying that a particular input may be connected to a particular output. Another example of a static check is verifying that the limits on the number of connections between at least one output to at least one input is satisfied. The prepackaged branches 313 are predefined behavior that describe behavior between two terminals in the design that do not have to be ports. Examples branches are resistors, capacitors, inductors, switches, clamps, and diodes. The prepackaged transistor models 315 are predefined behavior that describe the behavior of a transistor. These models are not the foundry provided compact models for the transistors but simpler behavioral models that are more efficient but complex enough to still be sufficient for analog, mixed-signal, and RF verification. The prepackaged passive component models 316 are predefined behavior that describe passive components in a design. Example passive components are resistors, capacitors, and inductors. These models are not the foundry provided compact models for passive components but simpler behavioral models that are efficient but complex enough to still be sufficient for analog, mixed-signal, and RF verification. The prepackaged assertion tests 320 are predefined behavior that checks that the assertions are working properly. The prepackaged power tests 321 are predefined behavior that includes measuring current consumption of blocks. The prepackaged common tests 322 are predefined behavior for tests. Example common tests are tests for analog-to-digital converters, tests for serial-deserializer blocks, and phase-locked loops. The assertion coverage test code 323 measures the extent to which assertions have been placed in the generated models and regression tests and the extent to which they have been exercised. All of the behavior described in the prepackaged library 218 is parameterized and may be customized by the user. The user interface to using the prepackaged components 310 to 323 are designed to be as modeling language independent as possible so that the user may target multiple languages for models, regression tests, netlists, and connect modules.

The components in the executable templates 216 shown in FIG. 4 are model templates 410, regression test templates 411, netlist templates 412, connect module templates 413, simulation launch scripts 414, symbol templates 415, and datasheet and report templates 416. Model templates 410 are templates for the behavioral models that are created from user provided specifications 712. Behavioral models represent integrated circuits, systems, or components of integrated circuit or systems. Models may also be empty where a model only includes the port information. Regression test templates 411 are templates for the regression tests that are created from user provided specifications 712. Regression tests are connected to either behavioral models or the design implementation to verify that the user specifications 712 have been achieved. Regression tests are also used to verify that a behavioral model for a design block matches the implementation. Regression tests may either describe the behavior to be achieved using information from the specifications, by including the behavioral model to represent the desired behavior, or instantiating the behavioral model to represent the desired behavior. The regression tests may be used in design verification and post manufacturing test. The regression test templates 411 also include tests that run on the design to calibrate models. For example, tests may be added to measure the current consumption of the design. These results are stored in the database 110. Then the models may be generated or regenerated from the model templates 410 to include these results. Netlist templates 412 are templates for netlists that indicate how design blocks are interconnected. An example netlist is a chip top-level netlist. The chip top-level netlist describes how a plurality of blocks at the chip level are connected. The blocks at the chip level may comprise pads, the digital subsystem, the analog subsystem, and the RF subsystem. Another example of a netlist is one that connects the regression tests to the behavior model or design to be simulated. The connect module templates 413 are templates for connect modules. Connect modules are found in some behavioral modeling languages such as Verilog-AMS. Connect modules convert signals from one domain to another. Domains include discrete or logic, electrical, mechanical, discrete analog, and baseband equivalent analog and RF. An example of a connect module is one that converts from the digital domain to the analog electrical signal domain. Manually written connect modules exist to convert from some domains to others. The preferred embodiment adds the ability to automatically generate connect modules from one domain to another as needed. The preferred embodiment also gives capability to the user to customize connect modules. Less common connect modules which the code and document generator 102 may generate include converting between the discrete analog domain to and from the electrical domain, and the baseband equivalent signal domain to and from the electrical domain. There is at least one template in the templates 410 to 416. At least one behavioral language is targeted in each of the templates 410 to 413. These languages include Verilog, Verilog-A, Verilog-AMS, Verilog with extensions for passing analog information, VHDL, VHDL-AMS, and SystemVerilog. Also included are variations on these languages as a result of simulator dependent implementations. The templates 410 to 413 are designed in such a way to make them extensible to future languages. The simulation launch script templates 414 are used to create user specific simulation launch scripts to start regression tests 121, to configure what design data 131 or model data 121 is to be used, and which simulator 132 is to be used. The simulation launch scripts that are generated are in a computer language that may run on the client 160 or on another computer of the user's choosing. The scripts are written in a scripting language. The scripts may be in a compiled form, may call routines that are written in a compiled language, and may be written in a compiled language. The simulation launch script templates 414 include simulation specifics and may be customized to a particular simulator. The symbol templates 415 are used to create the schematic symbol or used to create the code that generates the schematic symbol based on user specifications 712. The schematic symbol may be in a proprietary database format such as Cadence's CDB or in an open format such as OpenAccess. In addition to templates including the code or symbol data, the templates include common shapes for schematic symbols for common analog, mixed-signal, digital, and RF blocks. The datasheet and report templates 416 generate documents readable by users. The contents of these documents are derived from the analog verification database 110. Reports may contain all or some of the data in the database 110. For example, a datasheet may contain the user specifications 712. Reports may include register lists found in the users specifications 712, global digital control signal tables found in the user specifications 712, coverage analysis results 716, simulation completion analysis found in the simulation data 718, and user specifications with simulation results 718 indicating whether or not the specifications 712 were met. The format of the datasheets and reports include document, spreadsheet, presentation, document interchange format, and standard formats. Example document programs are Microsoft's Word, Adobe's Framemaker, and OpenOffice Writer. Example spreadsheet programs are Microsoft's Excel and OpenOffice Calc. Example presentation format are Microsoft's PowerPoint and OpenOffice Draw. Example document interchange formats are rich text format ("RTF"), maker interchange format ("MIF"), extensible markup language ("XML"), and comma-separated values ("CSV"). Standard formats include the hypertext markup language ("HTML"). The datasheet and reports may be in electronic format or printed. The executable templates 216 are applicable to all design types and do not require that specific design type information or circuit type information be incorporated in the templates.

The components of the analog verification server application 101 are shown in FIG. 5. The components, web interface routines 510, user payment account management routines 512, user/system administration routines, and a license manager 513 provide general web server functionality. More specific to the analog verification application are wiki components 520, general system utilities 521, database input and output routines 522, a portable document format ("PDF") generator for printable output 523, download routines 530, and output results display support 531. Specific to the analog verification application are a specifications organizer 540, specifications editor module 541, import routines 542, a regression test run progress analyzer 543, a revision control system 545, a simple and advanced mode controller 546, a verification plan editor 547, a regression test run controller 548, and simulation results to specifications back annotation routines 544. The components 510 to 544 provide capabilities to the user. The web interface routines 510 provide the input and output capabilities from and to the web server 111. These include generating HTML and Javascript and include handling input from the user through the HTML forms using the post mechanism. The user payment account management routines 511 handle the accounting and payment from users for the use of the capabilities provided by the platform 100. The data for these routines 511 are stored in the database 110. The user and system administration routines 512 include handling the user accounts and maintaining personal user data 717, such as names, addresses, and phone numbers. The license manager 513 handles authentication of the use of the server 150 code. The wiki components 520 give extended editing capabilities to the user when editing user specifications 712. These extended editing capabilities include adding text extensions, tables, and graphics. The graphics include schematics, waveforms, and timing diagrams. The general system utilities 521 provide basic functionality to support the server application 101. An example of a general system utility is data formatting. The database input and output routines 522 provide the capability to access the data in the analog verification database 110. The PDF generator for printable output 523 formats data from the analog verification database 110 into PDF that may be viewed by a PDF viewer such as Adobe's Acrobat Reader. The output results display support 531 provides the routines to format the data from the analog verification database 110 into a format that may be viewed by a web browser. These formats include HTML and Javascript. The output results display support 531 also provides support to adequately display results from design to specifications consistency checker data 714, and coverage analysis results 716. The download routines 530 enable the user to download generated documents and code 713 and generated symbols 715. Utilizing the download routines 530, the user may initiate a download of at least one output. The specifications organizer 540 provides the capabilities that allows the user to organize user specifications 712. Example organizational capabilities include sorting, linking, copying, deleting organizing hierarchically, and utilizing example specifications 710. The specifications editor module 541 allows the user to modify the contents in the user specifications 712. Modifying includes creating, displaying, updating, deleting contents in the specifications, and including example specification fragments 711. Updating includes copy, paste, and undo operations. The specifications editor 541 is suitable for editing component or top-level specifications. The import routines 542 allow the user to import information into specifications. Import formats include models manually written and models generated from the platform 100. For example, a Verilog model may be imported and the specifications may be pre-populated with port information. Other formats include formats developed for the platform 100, comma separated valued text files, an open source or commercial word processing format, and an open source or commercial spreadsheet format. The imported data may be incomplete or complete specifications. Imported data may include text, equations, and figures which may be placed in the generated datasheets and reports 120. The regression test run progress analyzer 543 reads simulation data and results 718 and returns progress information on simulations to the user. This information may include the number of simulations that have been run, the number that remain, and an estimate of the time required for the remaining simulations. The revision control system 545 allows the user to manage different versions of the specifications. The simple and advanced mode controller 546 gives the user the ability to switch between a mode with a simple user interface to one that is more complicated but which contains more advanced features. The verification plan editor 547 allows the user to modify verification plans 719. Modifying includes creating, displaying, updating, and deleting contents in verification plans. The regression test run controller 548 uses the data from the verification plans 719 to provide capabilities to manage the running of regression tests. The simulation results to specifications back annotation routines 544 provide the capability to take results from the simulation data and results 718 and merge them with the user specifications 712 to show which specifications have been met and which have not.

The coverage analyzer 105 is shown in FIG. 6. The components of the coverage analyzer 105 include a model coverage analyzer 610, a regression test coverage analyzer 611, a regression test run completeness analyzer 612, and an assertion execution completeness analyzer 613. The model coverage analyzer 610 checks to see how complete the generated model is from user specifications 712. For example, if the user does not specify sufficient information in the user specifications 712, the model coverage analyzer 610 will warn the user. The regression test coverage analyzer 611 measures how complete the regression tests are. The regression test run completeness analyzer 612 measures to what extent the regression tests were run. This includes checking to see if the regression tests previously run are still valid. For example, if the design data 131 or the user specifications 712 change after a regression test affected by those changes have been run, previous runs of the regression test run are considered invalid and not counted as part of the completeness metric. The assertion execution completeness analyzer 613 is used to verify that all of the assertions were executed and that the signals they are supposed to check were checked.

The database contents 110 are shown in FIG. 7. The contents 110 include example specifications 710, example specification fragments 711, user specifications 712, generated documents and code 713, results from the design to specifications consistency checker 714, generated symbols 715, coverage analysis results 716, user account information 717, simulation data and results 718, verification plans 719, and other housekeeping information 720. The other housekeeping information 720 are data required by any of the components in the server 150 in additional to the other contents 710 to 719 mentioned in the database 110. An example piece of housekeeping information are web session data to manage active users. In this case the component utilizing the other housekeeping information 720 is the web interface routines 510.

In this invention, design specifications 1001 serve as the starting point that drives the platform 100. The design specifications 1001 may be the specifications for an entire design or a component in the design. The design may be the design of an integrated circuit or a system. The specifications 1001 include the behavior of the design. The specifications 1001 may also include the behavior of the tests to be performed on the design. It is intended that for a design that there is a top-level specifications along with many specifications making up the components, blocks, and subsystems for that design. The design specifications 1001 shown in FIG. 10 includes many sections 1002 to 1015 which are intended to capture the specifications of an analog, mixed-signal, or RF integrated circuit or system design.

In the preferred embodiment, the specifications 1001 include parameters for the specifications 1002, port types used in the specifications 1003, a list of ports of the design being specified 1004, discrete variables used to describe the behavior 1005, continuous variables used to described the behavior 1006, user defined behavioral code 1007, user comments 1008, branches used to describe the behavior 1009, instances in the design 1011, register and global control signal maps of the design 1012, states in the design 1013, test sequences to be used on the design 1014, and look-up tables to aid in describing the behavior of the design 1015. Not all designs or design blocks need to include all of the sections listed in the specifications 1001. Each section of the specifications 1001 to 1003 and 1005 to 1015 may have zero or more items. The section of the specifications 1004 is required where at least one port needs to be described. This is because the specifications 1001 are based on a description of the ports. The behavior of the overall block or design being described may be captured with only a description of the ports and how the ports interrelate to each other. The other sections 1001 to 1003 and 1005 to 1015 add to section 1004 providing additional descriptions which ultimately connect to the ports in section 1004. The sections 1002 to 1015 of the specifications 1001 do not ask for information on the circuit type of the design. Information on the circuit type of the design is not required. Both analog ports and digital ports may be in the list of ports 1004. An analog port is a port that connects to an analog signal. A digital port is a port that connects to a digital signal.

These items are described by attributes 1102 to 1135 which may or may not be applicable in each of the sections 1002 to 1015. A table 1101 indicating which sections 1002 to 1015 include which attributes 1102 to 1135 is shown in FIG. 11. The specification sections 1002 to 1015 are shown in the top row of the table 1101. Attributes for each of these sections are shown in the first column 1102 to 1135. A check mark at the intersection of a row and a column indicates that the particular attribute 1102 to 1135 may be specified in a particular section 1002 to 1015 of the specifications. An item is described by the attributes listed.

An example is shown in FIG. 12. This example shows the list of ports section 1004. The attributes 1102, 1110 to 1117 associated with the list of ports section 1004 are listed in the top row of the table. Each item of this section of the specifications is a row in the table. In this example, there are six items 1201 to 1206. The list of ports 1004 section is specified in second to final row of the table. In this example, the user provides the contents in rows 1201 to 1206. Each box in each of the rows is a field in which the user may enter data.

Attributes 1102 to 1135 of each item are provided by the user. Examples to assist the user are provided in examples specifications 710 and example specification fragments 711. Name 1102 is a name given to an item. It has a specific meaning depending on what the specifications section 1002 to 1015 is. Description 1103 is given by the user and is not meant to be interpreted by the computer. Value 1104 is the value associated with an item. Aliases 1105 is an equivalent for the name 1102 and is considered the same when used in the specifications 1001. Differential 1106 indicates whether or not an item is differential in nature. Access methods 1107 define the methods by which the quantities in an item may be accessed. Pin types 1108 refer to types defined in modeling languages. The supply domain 1109 indicates to which supply domain an item belongs. This information facilitates static checks to validate that connections between input and outputs are in the same supply domain. Direction 1110 indicates a direction for an item. A port types attribute 1111 may take on a value of one of the port type contents 1003. A range 1112 indicates a valid range for the port 1111. A behavior 1113 describes the behavior of an item using an expression. A protected variable 1114 may be used to filter the input port. The filtered result is what is given in the protected variable 1114 entry. Affects analog 1115 indicates whether or not an item affects the analog section of a model or regression test. A reference port 1116 is used to indicate whether or not there is a reference port where rather than using ground as the default reference another port is used. For example, a signal may want to refer to a port which has a common mode voltage instead of ground. In this case, the port with the common mode voltage would be indicated in this field. Gmin 1117 refers to the minimum conductance to ground or a reference on that node. Pin number 1118 allows a user to enter a value associated with a port. An order 1119 field allows a user to order a list of items. Attributes 1120 allows the user to specify additional information about a port that may be used in both static and dynamic verification. For example, a bias current could have an attribute which indicates its tolerance. Another example would be a supply port could have an attribute indicating that it is regulated or unregulated. Symbol information 1121 contains specific information to aid in the generation of the symbol. Included in the symbol information is the location of the pin on the symbol. Test metrics 1122 provide information to assist in the automatic generation of the regression tests. A test metric could indicate that pin has to be tested exhaustively for all combinations or that only certain values need to be tested. For analog inputs, example test metrics 1122 include defining an input such as a sine wave, an input ramp, and an input test range. A variable type 1123 refers to the model variable type to be used. A trigger 1124 refers to what ports or variables cause the behavior of an item to change. Wait 1125 allows the user to specify a condition for a signal that must be met before behavior is to be executed. Initial 1126 specifies the initial condition for the item. A measurement unit 1127 specifies the measurement unit for an item. Example measurement units include ampere, volt, coulomb, joule, weber, meter, second, Ohm, and henry. Smooth 1128 specifies a variable that contains a smoothed version of the item. Branch type 1129 specifies the type of branch to be used. Connects 1130 specifies the connections for the branch, units, instances, or register map. Item parameters 1132 are additional information to be provided for an item. Instance reference 1133 provides a link to a specifications that is to become an instance of the specifications in which the instance reference is found. The location 1134 gives information as to where an item is to go. The default and state columns 1135 may add one or more columns to a table where the user may specify values for items when in the default state or specific states. For example, for an item in the ports section 1004 that is a digital port type 1111 with a direction 1110 of input, the default state could indicate that its value is to be zero. Another example is for a supply port type 1111, the default state could indicate its current consumption when in the default state. The behavior for the particular state could also be entered in the field. A behavioral condition may also be placed in the field to verify that when in a particular state, that the condition placed in the field has been met. During verification, when in default mode, an assertion could be added to verify that condition.

Some of the input fields for the attributes and specifications sections have a preselected set of values. Example options 1302 for input fields 1301 are shown in FIG. 13. Example names 1102 for items of the parameters section 1002 are listed in table entry 1310. Example values for pin types 1108 are listed in table entry 1311. Example port directions 1110 are listed in table entry 1312. Example port types 1111 are listed in table entry 1312. Example discrete variable types 1123 are listed in table entry 1314. Example branch types 1129 are listed in table entry 1315. The instance reference 1133 refers to other spec sheets and masters in the design data 131 as listed in table entry 1317.

Operation

This invention creates a design specifications-driven platform for accelerating and improving the quality of analog, mixed-signal, and RF verification. Starting from design specifications; models, regression tests, netlists, datasheets, symbols, connect modules, and simulation scripts may be automatically generated. In addition, reports may be generated that include coverage analysis, results from static checks of the design implementation to the specifications, and simulation results.

There are many flows that analog, mixed-signal, and RF designers use when designing and verifying an analog, mixed-signal, or RF integrated circuit or system. This invention fits into many design flows. These include top-down, bottom-up, and middle-out flows. An example flow 2000 in which this invention may be used is shown in FIG. 20. A design flow 2001 is on the left and a verification flow 2002 is on the right. A user of the design flow 2001 is likely a designer and is likely part of a design team all of whom may be using the design flow 2001 for a particular integrated circuit or system design. Designers may include analog, mixed-signal, RF, system, digital engineers, and a combination. A user of the verification flow 2002 is likely a verification engineer and is likely part of a verification team all of whom may be using the verification flow 2002. Verification engineers may include analog, mixed-signal, RF, system, digital verification engineers, and a combination. The user of the verification flow 2002 may also be a designer in the case where the design and verification effort is combined. Users of the platform 100 include analog verification engineers, analog designers, analog design leads, digital verification engineers, CAD engineers, and system engineers.

The flow 2000 begins at the start of a design 2010. The first step is the creation of the top-level datasheet 2011. The user may accomplish this using the datasheet generator 102. Working on a client computer 160, the user uses a web browser 130, connects to the web server 111, and accesses the analog verification server application 101. The top-level design specifications may be entered using the specifications editor 541. In this way, this embodiment of the platform 100 accepts the input of the specifications 1001 from the user. The designer utilizes the prepackaged library 218 to be more efficient when entering the specifications. A rich set of information may be entered using the wiki components 520. Examples 710 and 711 are also available to accelerate the effort. The specifications are stored in the database 110 in the user specifications 712 section. Once entered, the code and document generator 102 may be used to generate the data sheet utilizing the datasheet and report templates 416. The output of the code and document generator 102 is stored in the database 110 specifically in the generated documents and code 713 section. Then using the download routines 530, the data sheet goes through the web server 111 to the web browser 130 and finally stored 121 on the client 160. Once a version of the top-level datasheet has been agreed to by all of the interested parties to the design, the designers define an architecture for the integrated circuit or system and create the component datasheets 2012. The interested parties may include the team developing the integrated circuit or system and the team who will ultimately use the manufactured integrated circuit or system. The component datasheets 2012 may be generated in the same manner as the top-level datasheet described previously. At this point, an assessment is conducted to see if the design is feasible 2013. Step 2013 may include performing hand calculations, using a spreadsheet to predict performance, writing models, even implementing critical components, and running simulations. The datasheets 120 that were generated in steps 2011 and 2012 facilitate step 2013 by providing documentation that the engineers may study. This platform 100 may be used to generate models for this feasibility study. From the specifications entered, the code and document generator 102 is once again used, this time utilizing the model templates 410. If the design is determined to be not feasible, the top-level datasheet, architecture, and component datasheets are adjusted until feasibility is reached.

At this point, analog verification begins 2030 with the design flow 2001 and the analog verification flow 2002 running in parallel. Different engineers may be assigned to the different flows. The engineers on the design flow 2001 begin to implement the components 2014. For analog, mixed-signal, and RF circuits, implementing includes drawing schematics and performing at least one simulation to validate that the implementation meets the specifications.

For digital circuits, implementing includes writing RTL and drawing schematics to validate that the implementation meets specifications. The implementation results are stored in the design database 131. The first step in the analog verification flow 2001 is to create datasheets for the components 2031 if they were not previously created in step 2012. Once again, this may be done using the code and document generator 102 using the datasheet and report templates 416. If models exist that define the components or if the specifications are written in one of the formats that may be imported, the models or the specifications may be imported using the import routines 542 and serve as the starting point for the specifications. To manage all of the specifications for the components being entered, the specification organizer 540 and the revision control system 545 may be utilized.

Models are then created for the components 2032. Models are generated from the specifications 1001 using the code and document generator 102 utilizing the model templates 410. A portion of the generated model would include converting the behavior 1113 of analog ports described in the list of ports 1004. The next step is to develop regression tests for the components 2033. The specifications 1001 utilizing the code and document generator 102 and the regression test templates 411 are converted to at least one regression test. To efficiently run the regression tests on the models and implementation, simulation scripts are developed 2034. These simulation scripts are created using the code and document generator 102 utilizing the simulation launch script templates 414. The regression tests are then run on the models 2035. The simulation scripts 122 along with the models and regression tests 121 that were generated run on the simulators 132 producing results that are stored in the analog verification database 110 specifically in the simulated data and results section 718. Next, connect modules are developed 2036 to enable running the regression tests on the implementation 2037. The connect modules are generated using the code and document generator 102 utilizing the connect module templates 413. The simulation scripts 122 launch the regression tests on the implementation 2037 utilizing the regression test 121 on the implementation that is in the design database 131 using one of the simulators 132 verifying whether or not the implementation of the design is consistent with the specifications. The regression tests results are again stored in the analog verification database 110. To configure how the regression tests are launched, the regression test run controller 548 may be used. Configurations include scheduling and whether or not simulations are to run in parallel. Progress of the simulations may be monitored utilizing the regression test run progress analyzer 543. To configure the overall goals for the verification effort, the verification plan editor 547 may be used. Once entered, the verification plan is stored in the database 110 in the verification plans 719 section. Depending on how much the user wants to customize the details of the verification effort, the simple/advanced mode controller 546 may be utilized. Finally, to view the regression test results in the context of the specifications, the simulation results to specifications back annotation routines 544 are utilized, and the code and document generator 102 utilizing the datasheet and report templates 416 are used this time generating a report 120 which details how the desired specifications compare to simulated results. A datasheet 120 may also be generated which includes the specifications and a summary of the simulated results. The results may be viewed by the user using the output results display support 531 or on paper using the PDF generator for printable output 523. Steps 2031 to 2037 are repeated until all of the components that require models have been generated.

A set of static checks is then performed on the components. To accomplish this, design data 131 is extracted 2038 and stored on the server 150. The design data is then checked for consistency to the specifications 2039 stored in the analog verification database 110. This is accomplished using the design to specifications consistency checker 103. The results are stored in the database 110 specifically in the results from design to specifications consistency checker section 714. Component level coverage is then analyzed 2040. This is accomplished using the coverage analyzer 105. All aspects of coverage are measured including model coverage 610, regression test coverage 611, regression test run completeness 612, and assertion execution completeness 613. The coverage analysis results are stored in the database 110 specifically in the coverage analysis results section 716. After this, a user produces reports to document the component level work 2041. These reports may be generated using the code and document generator 102 utilizing the datasheet and report templates 416. The user may produce the reports in multiple formats to be more suitable for the audience or post processing. For example, a report in document form is more suitable for reading by another user while a report in a spreadsheet format is more suitable for post processing. All reports are generated as part of step 2041.

When the implement components step 2014 in the design flow 2001 completes, layout of the components 2015 begins. At the same time, as long as some of the components are complete, the design may be assembled and chip-level simulations begun 2016.

Developing schematic symbols for the components 2042 is required for the top-level work 2016 to 2017 and 2042 to 2053. The symbols are generated using the symbol generator 104 utilizing the symbol templates 415. The results are stored in the database 110 specifically in the generated symbols section 715. The generated symbols 121 may be used in the design flow 2001 by placing them in the design data 131 where they are instantiated as part of the assemble design and chip-level simulations step 2016. As the design is begin assembled, top-level verification may begin. The top-level netlist if it is not available from the assemble design step 2016 is created 2043. The top-level netlist is generated by the code and document generator 102 specifically using the netlist template 412. The next step is to produce register maps and top-level connectivity descriptions 2044. This may be done using the code and document generator 102 utilizing the datasheet and report templates 416.

The next set of steps 2045 to 2053 follow the same procedure as steps 2033 to 2041 at the component level. The platform 100 is used to generate the reports 120, code 121, and scripts 122 required to execute steps 2045 to 2053. These steps are: develop top-level regression tests 2045, develop simulation scripts 2046, run top-level regression tests on models 2047, develop connect modules 2048, run top-level regression tests on implementation 2049, extract the design data 2050, check design consistency 2051, analyze top-level coverage 2052, and produce reports for the top-level work 2053. The code and document generator 102 utilizing the templates 216, the consistency checker 103, symbol generator 104, and coverage analyzer 105 are used to accelerate steps 2045 to 2053.

In the design flow 2001, after the design has been assembled 2016, the top-level layout is then completed 2017 followed by final simulations 2018. Physical verification 2019 including layout versus schematics, and design rule checking procedures follow.

Either after or during steps 2017 to 2019, all of the regression tests are re-run 2054 on the final version of the design. All coverage is re-analyzed 2055 to confirm that verification is complete on the final version of the design. If there is no cause for concern from the analog verification team, the team signs off on the design 2056. The analog verification flow is complete 2057.

When the design team is satisfied that it has completed and implemented the design and the verification team has signed off on the design, the design team completes the final design steps 2020. This includes creating the data required for manufacturing. At this point, the design flow ends 2021.

A detailed flow for specifications entry and output generation is shown in FIG. 21. The start 2101 denotes the starting point of the flow which is at the point when the user is prepared to enter the specifications for a design or a component. The user enters the specifications 2102 using a web browser 130 that connects to a web server 111 that connects to an analog verification server application 101. The specifications 1001 are accepted and stored in the analog verification database 110. Entry of specifications is accelerated by the prepackaged library 216 and the examples 710 and 711. The specifications are saved 2103 to the database 110. The input is parsed 2104 by the code and document generator 102 that utilizes the user input parsers 213 and the access function parsers 212 routines. If there is an error 2105 or if at least one message needs to be communicated to the user, the errors or messages are stored in the database 110, and the errors or messages are presented to the user utilizing the specifications editor module 541. If there is no error, then at least one output is generated 2106. This is accomplished using the code and document generator 102 and the symbol generator 104. These utilize the executable templates 216. By doing so, the outputs may be models, regression tests, netlists, connect modules, symbols, 121, simulation scripts 122, and datasheets and reports 120. Messages are then displayed to the user 2107. These messages may include warnings or suggestions to the user on how to improve the output. The generated outputs are displayed to the user 2108. If the generated outputs are satisfactory 2109, the user is then given the option to download one or more of the outputs 2110. This ends 2111 the flow for generating outputs.

The flow for the preferred embodiment of the code and document generator 102 is shown in FIG. 22. After the start 2201, the first step is to retrieve the specifications 2202 from the database 110. Following retrieving the specifications using the database input/output routines 211, the specifications are stored locally using the data management module 210. Based on the desired output, the corresponding template is loaded 2203 from the executable templates 216. The template is then executed 2204. Executing the template requires the user input parsers 213, the access function parsers 212, routines to run executable templates 215, code fragment generators 214, the prepackaged library 218, and prepackaged library support routines 217. The template is then checked to see if there are fields requiring expansion 2205. Fields requiring expansion are either filled by the specifications input data or data derived from the input 2206 or filled by another template 216. If the check 2207 determines that another template is required, the load executable template step 2203 is performed again. The loop continues until the template no longer has any fields to complete. Messages including errors and warnings are saved 2208 to the database 110. The generated output is saved 2209 to the database 110. This completes 2210 the flow for the preferred embodiment of the code and document generator.

An example Verilog-AMS model 2301A and 2301B for a gain stage that has been generated is shown in FIG. 23A. The list of ports section 1004 of the specifications for this example is shown in FIG. 12. The module and input declarations 2310 are based on the list of ports section 1004 for ports 1201 to 1206. Analog assertions 2311 that are generated are also based on the list of ports section 1004 for ports 1201 and 1202. Finally, the analog behavior 2312 is also specified in the list of ports section 1004. The analog behavior is specified on ports 1201 and 1206 in this example.

Alternative Embodiments

There are alternative embodiments of this invention. A platform 100 need not contain all of the components shown in FIG. 1. A subset is sufficient to provide efficiency gains in analog verification. For example, generating only models does accelerate analog verification. In this case, the components required are a web browser 130, a web server 111, an analog verification server application 101, a code and document generator 102, an analog verification database 110, a client interface 124, and a server interface 106. For a subset of functionality, the components which are in a code and document generator 102, prepackaged library 218, executable templates 216, analog verification server application 101, coverage analyzer 105, and database contents 110 may also be a subset of the components described in the preferred embodiment. A platform 100 may also include additional components to provide more functionality. Further, the code and document generator 102 need not be one entity. The code and document generator 102 may be separated into a code generator and a separate and distinct document generator, and if only code is required, only the code generator need to be in the platform 100. If only documents are required, only the document generator need to be in the platform 100.

A platform 100 may also have at least one component implemented in a different manner. These different manners include at least one component being implemented differently, a plurality of components being combined, or at least one component being split into a plurality of components. Examples of how components may differ follows. Prepackaged library components 310 to 323 need not be described in an executable document description language. Alternative description approaches include using other formats and languages, a template where a search and replace mechanism is used, and a template which contains embedded code to generate the result. Instead of using an SQL database 110, the data may be stored in a set of files. Another example of a component being implemented in a different manner is to replace a symbol generator 104 with a symbol and schematic generator. In this way, netlists that are generated from a code and document generator 102 may also be represented by a schematic. Generated models, regression tests, netlists, connect modules, and symbols 121 would now also include schematics which would be stored as part of design data 131. An example schematic is a top-level schematic. Also, the code and document generator 102 may also generate a simulation launch script configuration file to be used by a simulation launch script itself as a way of separating the simulation launch script and configuration information specific to design.

Another embodiment of a platform 100 is that rather than be structured as a web based application, the platform 100 is structured as a stand alone application. Specifications would be edited in various means including using a custom editor, an open source or commercial word processor, and an open source or commercial spreadsheet program. An analog verification server application 101 would be part of the stand alone application providing a user interface directly on an operating system such as Microsoft Windows, MacOS, Solaris, Unix, or Linux. A client interface 124 and a server interface 106 may not be necessary.

Another embodiment of a platform 100 is where specifications are edited using various means including a custom editor, an open source or commercial word processor, and an open source or commercial spreadsheet program. An analog verification server application 101 would reside on a server 150 wherein the specifications editor would be enhanced to communicate with the server 150. An analog verification server application 101 and a server interface 106 would have an interface to the specifications editor.

The sections of the specifications 1001 do not have to be separated in the same way as shown in FIG. 10. A least one of the sections 1002 to 1015 may be split up into multiple sections, or a plurality of sections 1002 to 1015 may be combined into an individual section. An example is that the register section 1012 and states section 1013 may be combined. Also, all of the sections need not be present. For example if a platform 100 is only to generate models, then the test sequences section 1014 is not required. If only component models are to be generated, then the register and global control signals map 1012, instances 1011 are not necessary. Also, simple models may be generated from a small set of sections. For example, a simple model may be generated with only the sections—parameters 1002, port types 1003 and list of ports 1004. Finally, at least one additional section may be provided in the specifications 1001 to add additional functionality.

To simplify the description of port 1004 relationships, prepackaged units may be included in the prepackaged library 218. Prepackaged units offer a simplified way of describing analog basic building block functionality. For example, the prepackaged units may comprise drivers, receivers, branches, transistor models, and passive component models. These prepackaged units serve as a simplified method or short hand for describing the common analog behaviors at the port level within the design. A units section would be added to the specifications 1001. Units may include one or more of the predefined behaviors. As with all of the other sections in the specifications 1001, except for list of ports 1004, the units section may have zero or more entries.

In the table shown in FIG. 11 that shows which attributes 1102 to 1135 are associated with which specifications section 1002 to 1008, different embodiments may have different attributes for the different specifications sections. Attributes may be removed. New attributes may also be added.

The table shown in FIG. 13 lists example options 1302 for particular input fields 1301. The listed options 1310 to 1317 may be different in different embodiments. Options may be removed and new options may be added.

The first embodiment described in this patent application uses the term datasheet 416 to describe a human readable output document. The term specifications 1001 is used to describe an input to the code and document generator. In the field of analog, mixed-signal, and RF design, the term datasheet is often used synonymously with the term specifications. An alternative embodiment of the invention described in this patent application would be to use the term datasheet in addition to the term specifications to describe the specifications 1001. The term specification, the singular form of specifications, is also often used to mean specifications. An alternative embodiment of the invention described in this patent would also be to use the term specification in addition to the term specifications to describe the specifications 1001.

In the field of analog, mixed-signal, and RF design, the term testbench is used to refer to at least one test run on a model or a design implementation. The term testbench may be used in place of regression tests. Also, the testbench need not be self checking. The regression test templates 411 may contain a template for a testbench that is not self checking, where the comparison between the outputs of the model and the design implementation is done visually by the designer or the verification engineer.

An alternative to the server 150 containing at least one processor readable storage mechanism is that the server 150 is network connected to at least one processor readable storage mechanism. An alternative to the client 160 containing at least one processor readable storage mechanism is that the client 160 is network connected to at least one processor readable storage mechanism.

FIG. 12 serves as an example of one embodiment of a list of ports 1004. A different embodiment for the list of ports may be used. Instead of all of the attributes 1102 to 1117, a subset may be used. There may also be new attributes put into the list of ports 1004. Also, the syntax entered by the user in the attributes 1102 to 1117 may differ.

Alternative Uses

Many design and verification flows exist. The design and verification flow 2000 shown in FIG. 20 is only one example. Examples of different flows are as follows. The design flow 2001 may be combined with the verification flow 2002 to form a single flow. The steps 2010 to 2057, 2101 to 2111, and 2201 to 2210 do not have to be in the same order as shown in FIG. 20 to FIG. 22. The steps 2010 to 2057, 2101 to 2111, and 2201 to 2210 in FIG. 20 to FIG. 22 may be executed sequentially or in parallel.

Not all of the steps 2010 to 2057 in the design and verification flow 2000 need to be followed. Any amount of verification may lead to potential benefits in finding errors in the design. One example of a reduction is a flow that includes create datasheets if none available 2031, develop models for components 2032, create top-level netlists if not available 2043, develop top-level regression tests 2045, and run top-level regression tests on models 2047. In this flow, models 121 are created for the components. These models are then combined and tests are run on the top-level. This has the potential of catching top-level issues and interaction issues between the components. This reduced flow is not as comprehensive as the verification flow 2002 but still offers benefits. As the run top-level regression tests on the implementation step 2049 may be expensive in time, the flow may be reduced by removing this step. Other alternatives include completing this step is a mixed-level fashion. Mixed-level means that some of the components are simulated using the models while others are simulated using the design implementation. Multiple simulations may be conducted so that each of the components may be simulated at least once at the design implementation level. Another reduced flow is not to run regression tests on the models skipping steps 2035 and 2047 and running only on the implementation. In this way, the focus is to check the specifications directly against in the implementation. This may be done if the simulations of the implementation may run fast enough.

There are two approaches to verifying the consistency between a model and a design implementation. The first as described in the Design and Verification Flow 2000 is to run regression tests on the model 2035 and then to run regression tests on the implementation 2037. An alternative approach is to run the regression test on the model and implementation of the design simultaneously comparing the outputs from the model and the implementation to verify that the outputs are functionality consistent. To support this latter method, the regression test templates 411 would include a template that instantiates the model inside the regression test.

A user also need not work on all of the steps 2010 to 2057 at the same time. For example, a user may use a client 160 that has web browsing capabilities such as a mobile phone. Using a web browser 130 that is on the client 160, the user has access to many of the capabilities in the platform 100. For example, the user may access the regression test run progress analyzer 543.

The design and verification flow 2000 may also be extended to add additional steps to obtain additional benefits. An example is where a netlist is required at the component level to connect the regression test and models 121. In this case a netlist generation step is required between steps 2034 to 2035. Another extension is that rather than having two levels of hierarchy, a component level and a top-level, in the design and verification flow 2000, a verification flow may have a plurality of levels of hierarchy for the components. In this case, steps 2043 to 2052 are repeated for each intermediate level of hierarchy until the top-level is reached. Another extension is to add a model calibration step after step 2035 where results from the regression tests 2035 are put back into the model. In this case, the models are regenerated using the code and document generator 102 using information from the simulation results 718. Manual extensions may also be made to the reports 120, models, regression tests, netlists, connect modules, symbols 121, and simulation scripts 122 wherein said reports, models, regression tests, netlists, connect modules, symbols, and simulation scripts require additions to meet user needs. For example, a user of a platform 100 may not have entered a complete design specifications. In this case, after the code and document generator 102 is run, the user may manually insert additions into at least one output of the code and document generator. Another extension to the design and verification flow 2000 is to utilize model templates 410 to generate a model that includes utilizing the prepackaged assertions 310 and 314 and that instantiates the design. In this way, assertions may be applied to the design.

Another use is that a platform 100 need not be applied to only analog, mixed-signal, RF integrated circuit and system design. For example, the platform 100 may also be applied to a digital-only design, and a system design where the output is not a final chip but an architecture.

Another use of a platform 100 is to use the platform 100 in a programmatic manner. Rather than utilizing a human user interface such as a web browser 130 to access functionality 101 and data 110 in the platform, utilize the API in a server interface 106. A user may write a computer program to operate the platform 100. In this way, the user may achieve more automation and possibly increase efficiency. Computer programs may be written in a compiled language or in a scripting language.

A platform 100 may also be used in a flow where there is no verification flow, but only a design flow. For example, designers commonly develop models while implementing components 2014. Such as flow includes steps defining architecture and components 2012, checking for design feasibility 2013, implementing components 2014, and assembling the design and chip level simulations 2016. Another example of a design-only use of a platform 100 is as a specifications management system where the goal is to primarily use the datasheet and report templates 416 to generate datasheets.

A platform 100 may also be used primarily for model generation in both design and verification. In this case, specifications 712 are created for the design components 2012. Models for each component are generated in multiple languages to aid in the design and verification effort. For example, Verilog may be generated for the digital verification team. Verilog-A may be generated for the analog design team. Verilog-AMS may be generated for the analog verification team. This leads to significant time savings as the specifications only need to be entered once and multiple models are generated.

A platform 100 may also be used as part of other flows where the platform 100 is treated as a tool in the context of a larger flow. For example, there are many digital verification platforms and methodologies. A platform 100 may be used as part of that.

A platform 100 may also be applied to design for test and post manufacturing testing. Models, regression tests generated 121 and coverage analyzer 105 may be used as part of the design for test effort. The models and regression tests generated 121 may be applied in post manufacturing testing.

Not all design components need to follow the analog verification flow 2002. Pre-existing models may be used in place of generating ones from specifications. Instead of pre-existing models, the design implementation may also be used provided that the components simulated using the design implementation may simulate fast enough to complete the top-level regression tests 2049.

There may be at least one user using a platform 100 at any given time. Users may be collaborating or be working on different designs.

Custom digital design is logic circuitry designed without the aid of automated or semi-automated synthesis. As a result, custom digital design is very similar to analog design in that no model abstraction is available as a result of the design process, and a separate process is required to generate a behavioral model and has the same requirement that a regression test is needed to validate that the behavioral model is consistent with the design implementation. The invention described in this patent application may be applied to custom digital design.

Conclusion, Ramifications, and Scope

Thus the reader will see that at least one embodiment of this invention provides methods for generating models, regression tests, netlists, connect modules, simulation launch scripts, simulation launch script configuration files, and schematic symbols for a design based on the specifications for that design. While the above description contains many specificities, these should not be construed as limitations on the scope, but rather as an exemplification of one preferred and alternative embodiments thereof. Many other variations are possible. Accordingly, the scope should be determined not by the embodiments illustrated, but by the appended claims and their legal equivalents.

The invention claimed is:

1. A method for verifying a design, comprising:
   a. entering at least one design specification for said design;
   b. storing said at least one design specification; and
   c. using a code and document generator to convert said at least one design specification to at least one behavioral model;
   wherein said design is at least one selected from the group consisting of an analog design, a mixed-signal design, and a radio-frequency design.

2. The method of claim 1, further comprising:
   d. using said code and document generator to convert said at least one design specification to at least one regression test.

3. The method of claim 2, further comprising:
   e. performing at least one simulation utilizing said regression test;
   f. storing results of said at least one simulation; and
   g. utilizing said code and document generator and said results to generate at least one selected from the group consisting of a datasheet and a report.

4. The method of claim 2, further comprising:
   e. performing at least one simulation utilizing said regression test; and
   f. verifying that at least one implementation of said design and said at least one design specification is consistent.

5. The method of claim 4, further comprising:
   g. measuring coverage wherein said coverage is at least one selected from the group consisting of model coverage, regression test coverage, regression test run completeness, and assertion execution completeness.

6. The method of claim 1, further comprising:
   d. utilizing a web server and a database.

7. The method of claim 1, wherein said at least one design specification comprises at least one behavior for at least one analog port, and wherein said code and document generator contains at least one model template to convert said at least one behavior into a portion of said at least one behavioral model.

8. A processor-readable storage medium containing instructions that, upon execution, result in the implementation of the operations, comprising:
   a. accepting at least one design specification for a design;
   b. storing said at least one design specification; and
   c. converting said at least one design specification to at least one behavioral model;
   wherein said design is at least one selected from the group consisting of an analog design, a mixed-signal design, and a radio-frequency design.

9. The storage medium of claim 8, wherein said operations further comprising:
   d. converting said at least one design specification to at least one regression test.

10. The storage medium of claim 9, wherein said operations further comprising:
    e. performing at least one simulation utilizing said regression test;
    f. storing results of said at least one simulation; and
    g. utilizing said code and document generator and said results to generate at least one selected from the group consisting of a datasheet and a report.

11. The storage medium of claim 9, wherein said operations further comprising:
    e. performing at least one simulation utilizing said regression test; and
    f. verifying that at least one implementation of said design and said at least one design specification is consistent.

12. The storage medium of claim 11, wherein said operations further comprising:
    g. measuring coverage wherein said coverage is at least one selected from the group consisting of model coverage, regression test coverage, regression test run completeness, and assertion execution completeness.

13. The storage medium of claim 8, wherein said operations further comprising:
    d. utilizing a web server and a database.

14. The storage medium of claim 8, wherein said at least one design specification comprises at least one behavior for at least one analog port, and wherein said converting utilizes at least one model template to convert said at least one behavior into a portion of said at least one behavioral model.

15. A method, comprising:
a. entering at least one design specification for a design;
b. storing said at least one design specification; and
c. using a code and document generator to convert said at least one design specification to code;
wherein said design is at least one selected from the group consisting of an analog design, a mixed-signal design, a radio-frequency design, and a custom digital design.

16. The method of claim 15 wherein said code is to be interpreted by at least one selected from the group consisting of a simulator, a general purpose computer language interpreter, and an application.

17. The method of claim 16 wherein said code further comprising at least one selected from the group consisting of at least one behavioral model, at least one regression test, at least one netlist, at least one connect module, at least one simulation launch script, at least one simulation launch script configuration file, and at least one symbol.

18. The method of claim 15 wherein said code comprises at least one behavioral model, and at least one regression test.

19. The method of claim 18, further comprising:
d. performing at least one simulation utilizing said regression test;
e. verifying that at least one implementation of said design and said at least one design specification is consistent.

20. The method of claim 15, further comprising:
d. utilizing a web server and a database.

* * * * *